US011177360B2

(12) United States Patent
Hoshi

(10) Patent No.: US 11,177,360 B2
(45) Date of Patent: Nov. 16, 2021

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/856,891

(22) Filed: Apr. 23, 2020

(65) Prior Publication Data

US 2020/0395456 A1 Dec. 17, 2020

(30) Foreign Application Priority Data

Jun. 14, 2019 (JP) .............................. JP2019-111577

(51) Int. Cl.
*H01L 29/423* (2006.01)
*H01L 29/08* (2006.01)
*H01L 29/78* (2006.01)

(52) U.S. Cl.
CPC .... *H01L 29/42372* (2013.01); *H01L 29/0865* (2013.01); *H01L 29/7815* (2013.01)

(58) Field of Classification Search
CPC ........... H01L 29/42372; H01L 29/0865; H01L 29/7815; H01L 29/1095; H01L 29/1608; H01L 29/66068; H01L 29/66734; H01L 29/7805; H01L 29/7804; H01L 29/7811; H01L 29/0878; H01L 29/0623; H01L 29/7813; H01L 29/66613–66628; H01L 29/7825; H01L 29/66325–66348; H01L 29/7393–7398; H01L 29/083–0834; H01L 2924/13055
See application file for complete search history.

(56) References Cited

U.S. PATENT DOCUMENTS

| 2011/0012195 | A1* | 1/2011 | Momota | ............. | H01L 27/0658 |
| | | | | | 257/334 |
| 2016/0276333 | A1* | 9/2016 | Katakura | ........... | G01R 31/2601 |
| 2017/0111037 | A1* | 4/2017 | Shiigi | ................. | H01L 29/1608 |
| 2017/0179109 | A1* | 6/2017 | Toyoda | ............... | H01L 29/8611 |
| 2018/0277638 | A1* | 9/2018 | Hoshi | .................... | H01L 27/085 |
| 2019/0341483 | A1* | 11/2019 | Harada | ............... | H01L 29/0869 |

FOREIGN PATENT DOCUMENTS

| JP | 2017-079324 A | 4/2017 |
| JP | 2018-006360 A | 1/2018 |

* cited by examiner

*Primary Examiner* — Shahed Ahmed
(74) *Attorney, Agent, or Firm* — Rabin & Berdo, P.C.

(57) ABSTRACT

A semiconductor device having, in a main non-operating region that is free of unit cells of a main semiconductor element, a gate insulating film and a gate electrode of a current sensing portion extending on a front surface of a semiconductor substrate, to thereby form a planar gate structure. A gate capacitance of the planar gate structure is a gate capacitance of the current sensing portion. Directly beneath the planar gate structure, at the front surface of the semiconductor substrate, a structure is provided in which, from a front side of the semiconductor substrate, a p-type region, an n-type region, and a p-type region are stacked, whereby electric field is not applied to the extended portions of the gate insulating film.

7 Claims, 16 Drawing Sheets

US 11,177,360 B2

SEMICONDUCTOR DEVICE

CROSS REFERENCE TO RELATED APPLICATIONS

This application is based upon and claims the benefit of priority of the prior Japanese Patent Application No. 2019-111577, filed on Jun. 14, 2019, the entire contents of which are incorporated herein by reference.

BACKGROUND OF THE INVENTION

1. Field of the Invention

Embodiments of the invention relate to a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs) that have an insulated gate formed by a three-layered structure including a metal, an oxide film, and a semiconductor material. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

Further, MOSFETs structurally differ from IGBTs, have a built-in parasitic diode formed by a pn junction between a p-type base region and an n⁻-type drift region, and may use this parasitic diode as a free-wheeling diode for protecting the MOSFET. Therefore, instances in in which a MOSFET is used as an inverter device are gaining attention in terms of being economical since no external free-wheeling diode needs to be connected to the MOSFET.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable semiconductor material, has a wide bandgap of 3 eV, and can be used very stably as a semiconductor material even at high temperatures. Further, silicon carbide has a critical field strength that is at least ten times greater than the critical field strength of silicon and therefore, is expected to be a semiconductor material capable of sufficiently reducing ON resistance. Such characteristics of silicon carbide are shared by other wide bandgap semiconductor materials that have a bandgap wider than that of silicon (hereinafter, wide bandgap semiconductor material).

A structure of a conventional semiconductor device will be described taking as an example, an n-channel MOSFET that uses silicon carbide (SiC) as a wide bandgap semiconductor material. FIG. 16 is a plan view of a layout when the conventional semiconductor device is viewed from a front side of a semiconductor substrate. In FIG. 16, an outer periphery of a p-type base region 134b' of a main non-operating region 101b is indicated by a dashed line. An inner periphery of the p-type base region 134b' is a same as an outer periphery of an n⁻-type region 132b. A p-type base region 134b of a sensing effective region 112a is indicated by hatching.

FIGS. 17, 18, and 19 are cross-sectional views of a structure of an active region depicted in FIG. 16. FIG. 17 depicts a cross-sectional view of the structure of a main effective region 101a and a current sensing portion 112 (cross-sectional view along cutting line X101-X102-X103-X104-X105). FIG. 18 depicts a cross-sectional view of the structure of the main effective region 101a, a sensing non-operating region 112b, and a temperature sensing portion 113 (cross-sectional view along cutting line X101-X102-X103 and cutting line Y101-Y102).

FIG. 19 depicts a cross-sectional view of the structure of the main effective region 101a, the sensing non-operating region 112b, and a gate pad portion 114 (cross-sectional view along cutting line X101-X102-X103 and cutting line Y102-Y103). In FIGS. 18 and 19, while the sensing effective region 112a is not depicted, a cross-sectional view of the structure of the sensing effective region 112a is similar to that along cutting line X104-X105 depicted in FIG. 17.

A conventional semiconductor device 120 depicted in FIGS. 16 to 19 has, in an active region 101 of a single semiconductor substrate 110 containing silicon carbide, a main semiconductor element 111 and one or more circuit regions for protecting/controlling the main semiconductor element 111. The main semiconductor element 111 is a vertical MOSFET and is configured by plural unit cells (functional units of the element, not depicted) disposed adjacent to one another in an effective region (hereinafter, main effective region) 101a of the active region 101.

A source pad 121a of the main semiconductor element 111 is provided on the front surface of the semiconductor substrate 110, in the main effective region 101a. The circuit region for protecting/controlling the main semiconductor element 111 is disposed in a region (hereinafter, main non-operating region) 101b of the active region 101 excluding the main effective region 101a. In the main non-operating region 101b, no unit cells of the main semiconductor element 111 are disposed.

A surface area of the main non-operating region 101b is large as compared to that of a main non-operating region of a semiconductor device (semiconductor device in which only a gate pad is disposed in the main non-operating region) without a circuit region for protecting/controlling the main semiconductor element 111. The circuit region for protecting/controlling the main semiconductor element 111, for example, may be a high-function region such as the current sensing portion 112, the temperature sensing portion 113, an over-voltage protecting portion (not depicted), and an the arithmetic circuit portion (not depicted).

The current sensing portion 112 is a vertical MOSFET that includes unit cells each having a configuration similar to a configuration of the unit cells of the main semiconductor element 111, of a quantity (total number) fewer than a quantity (total number) of the unit cells of the main semiconductor element 111. The current sensing portion 112 is disposed to be separate from the main semiconductor element 111. The current sensing portion 112 operates under conditions similar to those of the main semiconductor element 111 and detects overcurrent (OC) flowing in the main semiconductor element 111.

The unit cells of the current sensing portion 112 are disposed in a region (hereinafter, sensing effective region) 112a that is a portion of a region of the semiconductor substrate 110, covered by an electrode pad (hereinafter, OC pad) 122 of the current sensing portion 112. In the region of the semiconductor substrate 110, covered by the OC pad 122, a region (hereinafter, sensing non-operating region) 112b excluding the sensing effective region 112a is a region in which none of the unit cells of the current sensing portion 112 are disposed and that does not function as the current sensing portion 112.

In substantially an entire area of the sensing non-operating region 112b, the p-type base region 134b' is provided at a surface region of the semiconductor substrate 110. A p$^+$-type region 162b' is provided between the p-type base region 134b' and an n$^-$-type drift region 132. The p-type base region 134b' and the p$^+$-type region 162b' of the sensing non-operating region 112b are separated from the sensing effective region 112a by the n$^-$-type region 132b that surrounds a periphery of the sensing effective region 112a.

The p-type base region 134b' of the sensing non-operating region 112b is connected to a p-type base region 134a of the main semiconductor element 111 and is fixed at a source electric potential of the main semiconductor element 111. Further, the p-type base region 134b' and the p$^+$-type region 162b' of the sensing non-operating region 112b extend in an entire area of a region of the main non-operating region 101b excluding the sensing effective region 112a and are disposed directly beneath electrode pads other than the source pad 121a.

The electrode pads other than the source pad 121a are provided on the front surface of the semiconductor substrate 110, in the main non-operating region 101b, via a field insulating film 180. In FIG. 16, the source pad 121a, a gate pad 121b, the OC pad 122, and electrode pads (an anode pad 123a and a cathode pad 123b) of the temperature sensing portion 113 are respectively indicated by "S", "G", "OC", "A" and "K". Reference numeral 102 is an edge termination region.

Reference characters 133a to 150a, 161a, and 162a are parts of a trench-gate type MOSFET configuring the main semiconductor element 111. Reference characters 133b to 150b, 161b, and 162b are part of a trench-gate type MOSFET configuring the current sensing portion 112. Reference numerals 131, 132, and 151 are respectively an n$^+$-type drain region, an n$^-$-type drift region, and a drain electrode common to the main semiconductor element 111 and the current sensing portion 112.

Reference numerals 181 and 182 are a p-type polysilicon layer that is a p-type anode region and an n-type polysilicon layer that is an n-type cathode region, respectively, of the temperature sensing portion 113. Reference characters 183a and 183b are contact holes of an interlayer insulating film 183 that covers the temperature sensing portion 113. Reference characters 147c, 147d, 148c, 148d, 149c, and 150c are parts of a wiring structure of the temperature sensing portion 113.

Reference character 136e is a p$^{++}$-type contact region that is provided between the p-type base region 134b' of the main non-operating region 101b and the front surface of the semiconductor substrate 110, and that faces the gate pad 121b in a depth direction. Reference characters 142e to 145e are metal films configuring a barrier metal 146e disposed between the gate pad 121b and the field insulating film 180. Reference characters 147e to 150e are part of a wiring structure of the gate pad portion 114.

Further, as compared to a planar gate structure in which a channel is formed along the front surface of the semiconductor substrate accompanying large current, a trench gate structure in which a channel (inversion layer) is formed in a direction orthogonal to the front surface of the semiconductor substrate, along a sidewall of a gate trench is advantageous in terms of cost. A reason for this is that a trench gate structure enables unit cell (functional unit of an element) density per unit area to be increased and thereby, enables current density per unit area to be increased.

A rate of temperature rise relative to a volume occupied by the unit cells increases by an extent to which device current density is increased and therefore, to enhance discharge efficiency and stabilize reliability, a double-sided cooling structure is necessary. Further, with consideration of reliability, on a single semiconductor substrate with a vertical MOSFET that is a main semiconductor element, a high-function structure is necessary in which high-function regions such as the current sensing portion, the temperature sensing portion, and the over-voltage protecting portion are disposed as circuit regions for protecting/controlling the main semiconductor element.

As an example of a conventional semiconductor device, a device has been proposed that is a SiC-MOSFET containing silicon carbide, that is a semiconductor device including high-function regions such as a current sensing portion, a temperature sensing portion, and an the over-voltage protecting portion on a single semiconductor substrate that has a main semiconductor element, and that includes a temperature sensing portion, a gate pad, etc. on the front surface of the semiconductor substrate, via a thick field insulating film, in a sensing non-operating region (for example, refer to Japanese Laid-Open Patent Publication No. 2017-079324).

As another example of a conventional semiconductor device, a device has been proposed in which gate trenches of a main effective region have a stripe shape and gate trenches of a sensing effective region have a substantially lattice shape, whereby an area that a gate insulating film contacts a base region in the sensing effective region is made larger than an area that a gate insulating film contacts a base region in the main effective region and gate capacitance of the sensing effective region is made larger than gate capacitance of the main effective region (for example, refer to Japanese Laid-Open Patent Publication No. 2018-006360).

SUMMARY OF THE INVENTION

According to an embodiment of the invention a semiconductor device includes a semiconductor substrate having a first main surface and a second main surface opposite to the first main surface, the semiconductor substrate having, in a top view of the semiconductor device, first and second effective regions and a non-operating region that excludes the first and the second effective regions; a first first-conductivity-type region, provided in the semiconductor substrate; a first second-conductivity-type region, provided between the first main surface of the semiconductor substrate and the first first-conductivity-type region; a first insulated gate field effect transistor formed in the first effective region, the first insulated gate field effect transistor having a drift region that is formed by the first firstconductivity-type region, and a base region that is formed by the first second-conductivity-type region, the first insulated gate field effect transistor including a plurality of first unit cells each having a first cell structure; a first source pad for the first insulated gate field effect transistor, provided at the first main surface of the semiconductor substrate, the first source pad being electrically connected to the first second-conductivity-type region; a second second-conductivity-type region, provided between the first main surface of the semiconductor substrate and the first first-conductivity-type region, in a region different from the first second-conductivity-type region; a second insulated gate field effect transistor provided in the second effective region, the second insulated gate field effect transistor having a drift region that is formed by the first first-conductivity-type region, and a base region that is formed by the second second-conductivity-type region, the second insulated gate field effect transistor including a plurality of second unit cells each having a second cell structure, the first and second cell structures being the same, a total number of the second unit cells being less than a total number of the first unit cells; a second source pad for the second insulated gate field effect transistor, provided on the first main surface of the semiconductor substrate, separate from the first source pad, the second source pad being electrically connected to the second second-conductivity-type region; a third second-conductivity-type region provided in the non-operating region, between the first main surface of the semiconductor substrate and the first first-conductivity-type region, the third second-conductivity-type region surrounding a periphery of the second effective region and being separate from the second effective region; a planar gate structure configured by a gate insulating film and a gate electrode, for the second insulated gate field effect transistor, extending on the first main surface of the semiconductor substrate in the non-operating region; a second first-conductivity-type region, provided in the non-operating region, between the first main surface of the semiconductor substrate and the third second-conductivity-type region, the second first-conductivity-type region facing the planar gate structure in a depth direction; a fourth second-conductivity-type region, provided in the non-operating region, between the first main surface of the semiconductor substrate and the second first-conductivity-type region, the fourth second-conductivity-type region facing the planar gate structure in the depth direction; a third first-conductivity-type region, provided between the second main surface of the semiconductor substrate and the first first-conductivity-type region, the third first-conductivity-type region having an impurity concentration that is higher than an impurity concentration of the first first-conductivity-type region; and a drain electrode common to the first insulated gate field effect transistor and the second insulated gate field effect transistor, the drain electrode forming an ohmic contact with the second main surface of the semiconductor substrate and being electrically connected to the third first-conductivity-type region.

In the embodiment, the second source pad covers a region of the semiconductor substrate. The second effective region is a portion of the region covered by the second source pad, and the planar gate structure is provided in the region covered by the second source pad but not in the second effective region.

In the embodiment, the semiconductor device further includes one or more electrode pads provided, separately from the first source pad and the second source pad, on the first main surface of the semiconductor substrate in the non-operating region. The planar gate structure extends directly beneath at least one of the one or more electrode pads.

In the embodiment, the semiconductor device further includes a fourth first-conductivity-type region, provided between the second second-conductivity-type region and the third second-conductivity-type region, the fourth first-conductivity-type region surrounding a periphery of the second second-conductivity-type region; and an oxide film provided between the gate insulating film configuring the planar gate structure and the first main surface of the semiconductor substrate, the oxide film covering the fourth first-conductivity-type region.

In the embodiment, a distance between the second second-conductivity-type region and the third second-conductivity-type region is at least 0.1 µm.

In the embodiment, the second insulated gate field effect transistor detects overcurrent flowing in the first insulated gate field effect transistor.

In the embodiment, the semiconductor substrate is formed of a semiconductor material having a bandgap that is wider than a bandgap of silicon.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
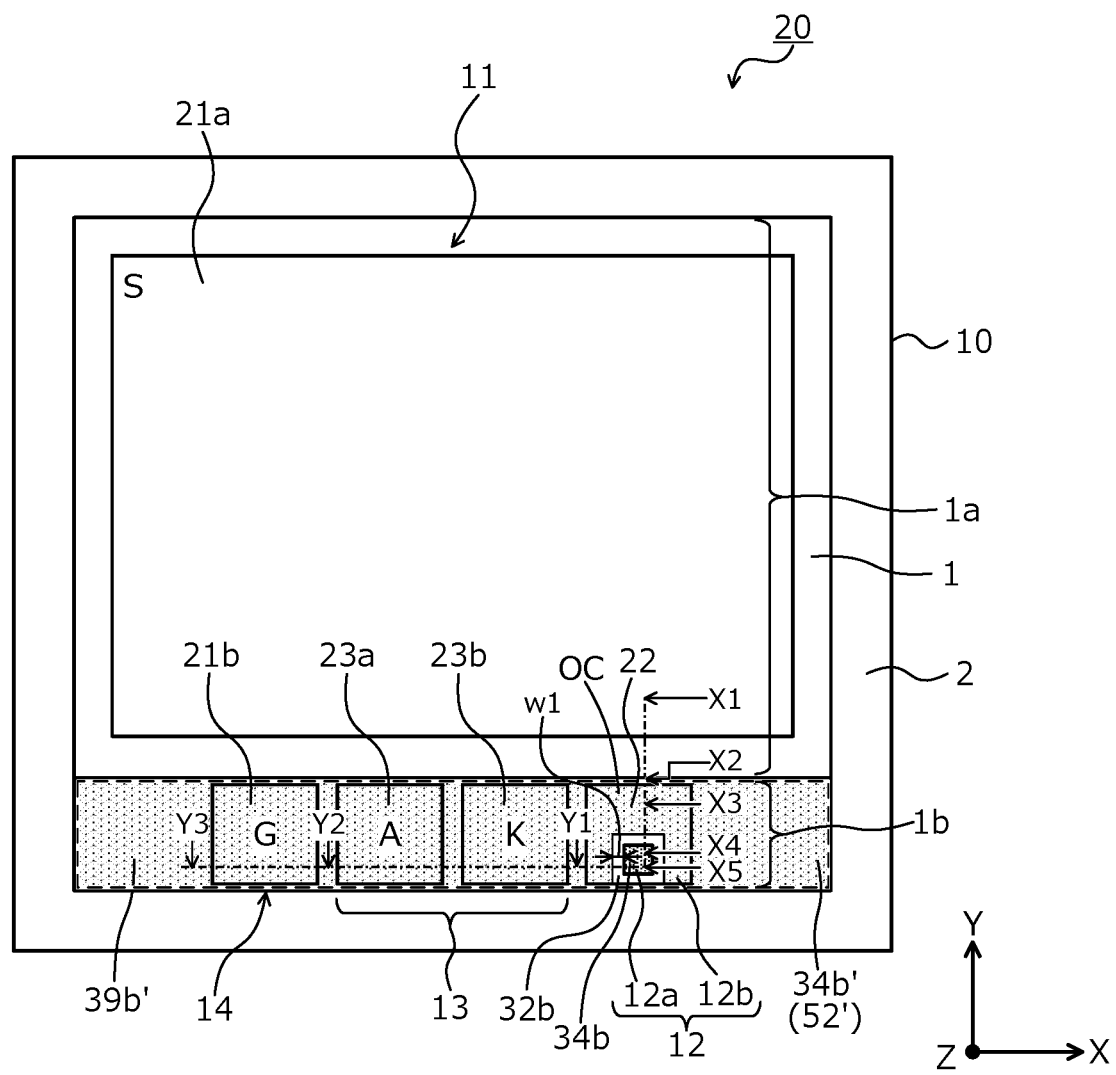
FIG. 1 is a plan view of a layout when a semiconductor device according to a first embodiment is viewed from a front side of a semiconductor substrate.

First, problems associated with the conventional techniques will be discussed. In the conventional semiconductor device 120 (refer to FIGS. 16 to 19), the surface area of the sensing effective region 112a is $\frac{1}{1000}$ or less of the surface area of the main effective region 101a and is small as compared to the surface area of the main effective region 101a. Therefore, the gate capacitance of the current sensing portion 112 is smaller than the gate capacitance of the main semiconductor element 111 and electrostatic discharge (ESD) capability of the current sensing portion 112 is low as compared to ESD capability of the main effective region 101a. As a result, compared to a gate insulating film 138a of the main semiconductor element 111, a gate insulating film 138b of the current sensing portion 112 is easily destroyed.

For example, in the region of the semiconductor substrate 110 covered by the gate pad 121b, unit cells (not depicted) of the trench-gate type MOSFET not functioning as a MOSFET are disposed, these MOS gates of the trench-gate type MOSFET not functioning as a MOSFET are electrically connected to MOS gates of the current sensing portion 112, whereby the gate capacitance of the current sensing portion 112 is increased and the ESD capability of the current sensing portion 112 may be increased. Nonetheless, an extent to which the gate trenches are increased, depending on formation precision of the gate trenches, new problems arise in that characteristics of the semiconductor device 120 degrade and yield decreases.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A semiconductor device according to a first embodiment contains a semiconductor material (wide bandgap semiconductor material) having a bandgap wider than that of silicon (Si) as a semiconductor material. A structure of the semiconductor device according to the first embodiment will be described, taking as an example, a case in which, for example, silicon carbide (SiC) is used as a wide bandgap semiconductor material. FIG. 1 is a plan view of a layout when the semiconductor device according to the first embodiment is viewed from a front side of a semiconductor substrate.

Figure 12:
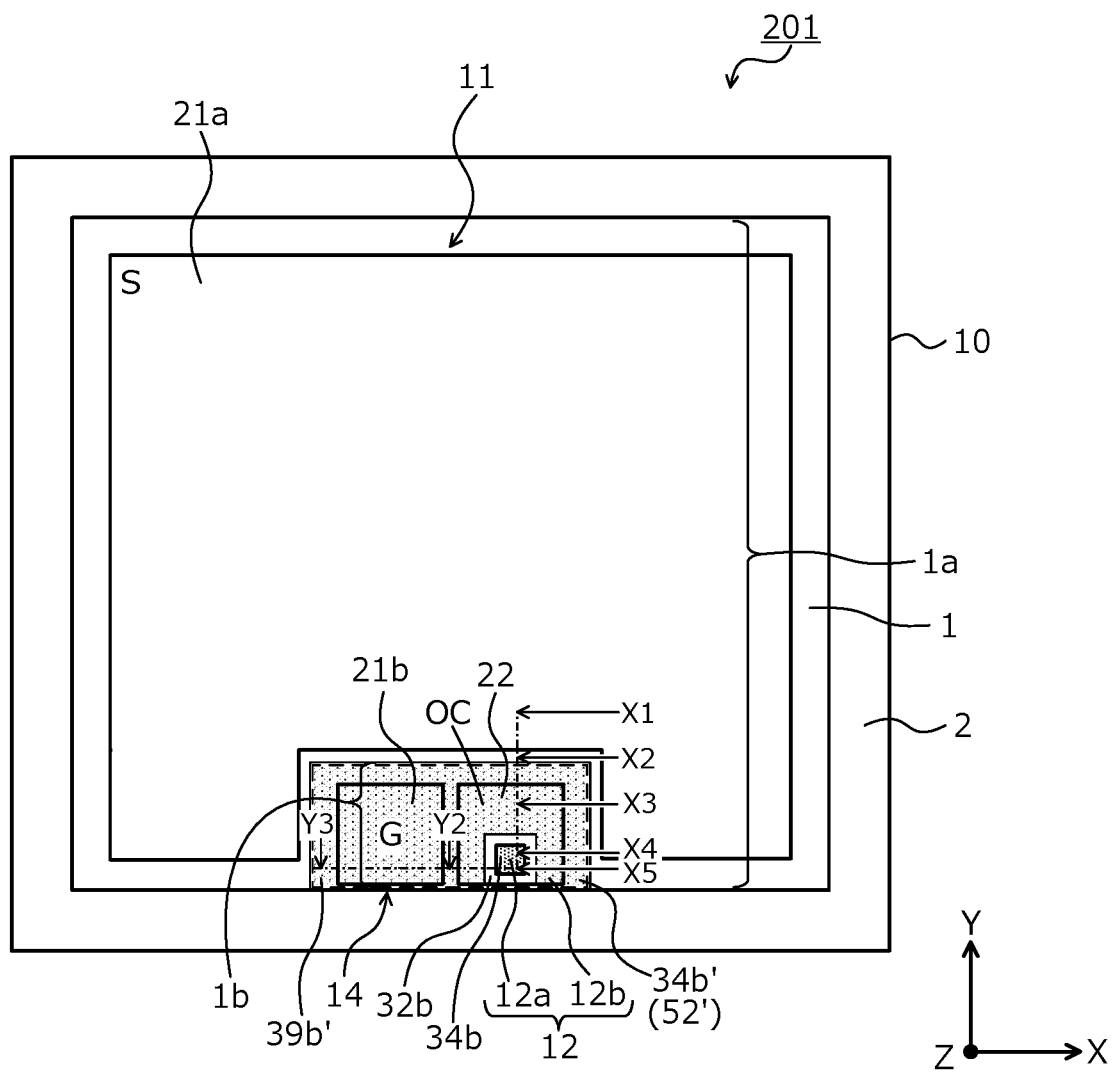
FIG. 12 is a plan view of a layout when a semiconductor device according to a second embodiment is viewed from the front side of the semiconductor substrate.
Figure 13:
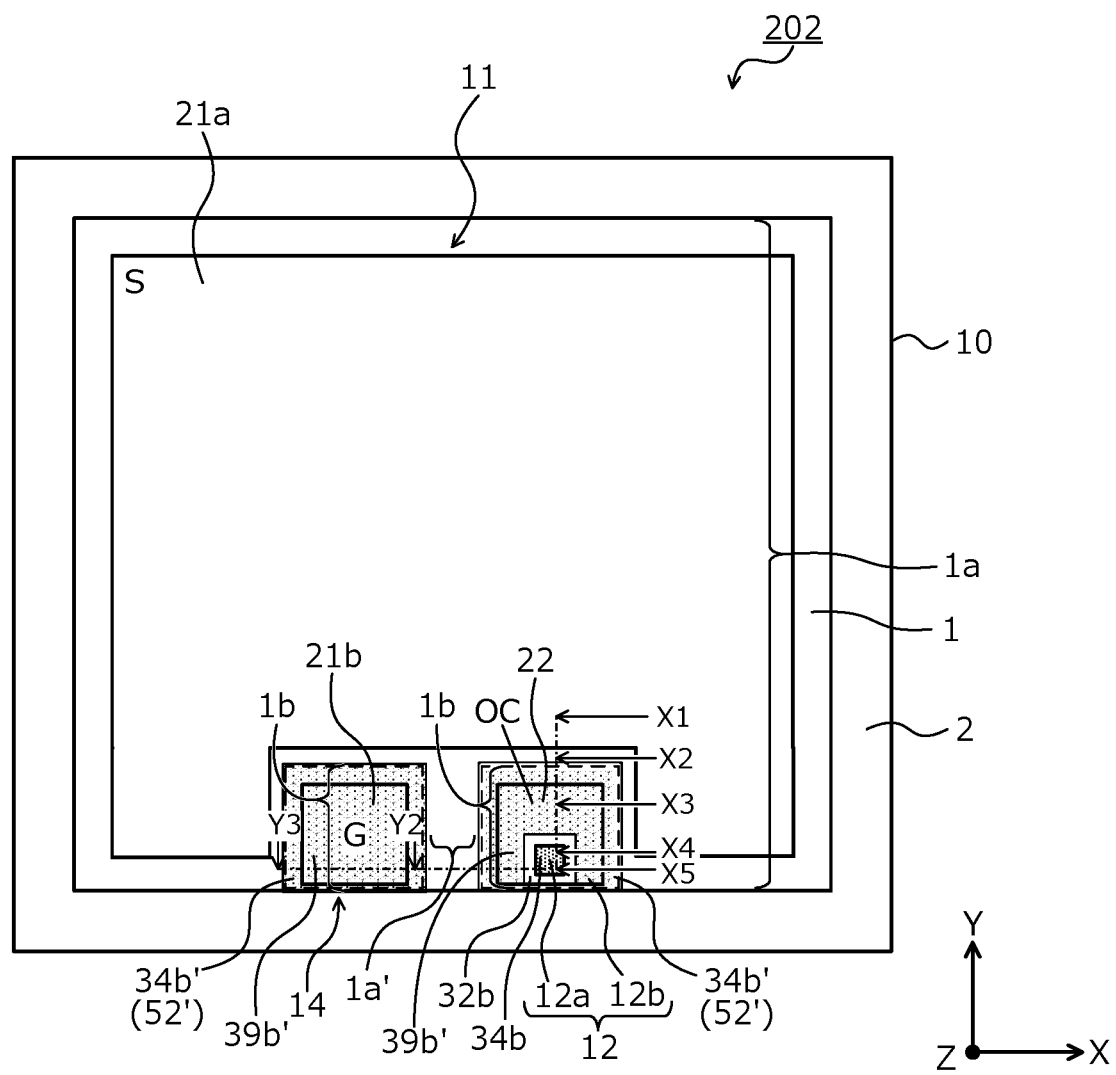
FIG. 13 is a plan view of a layout when a semiconductor device according to a third embodiment is viewed from the front side of the semiconductor substrate.
Figure 14:
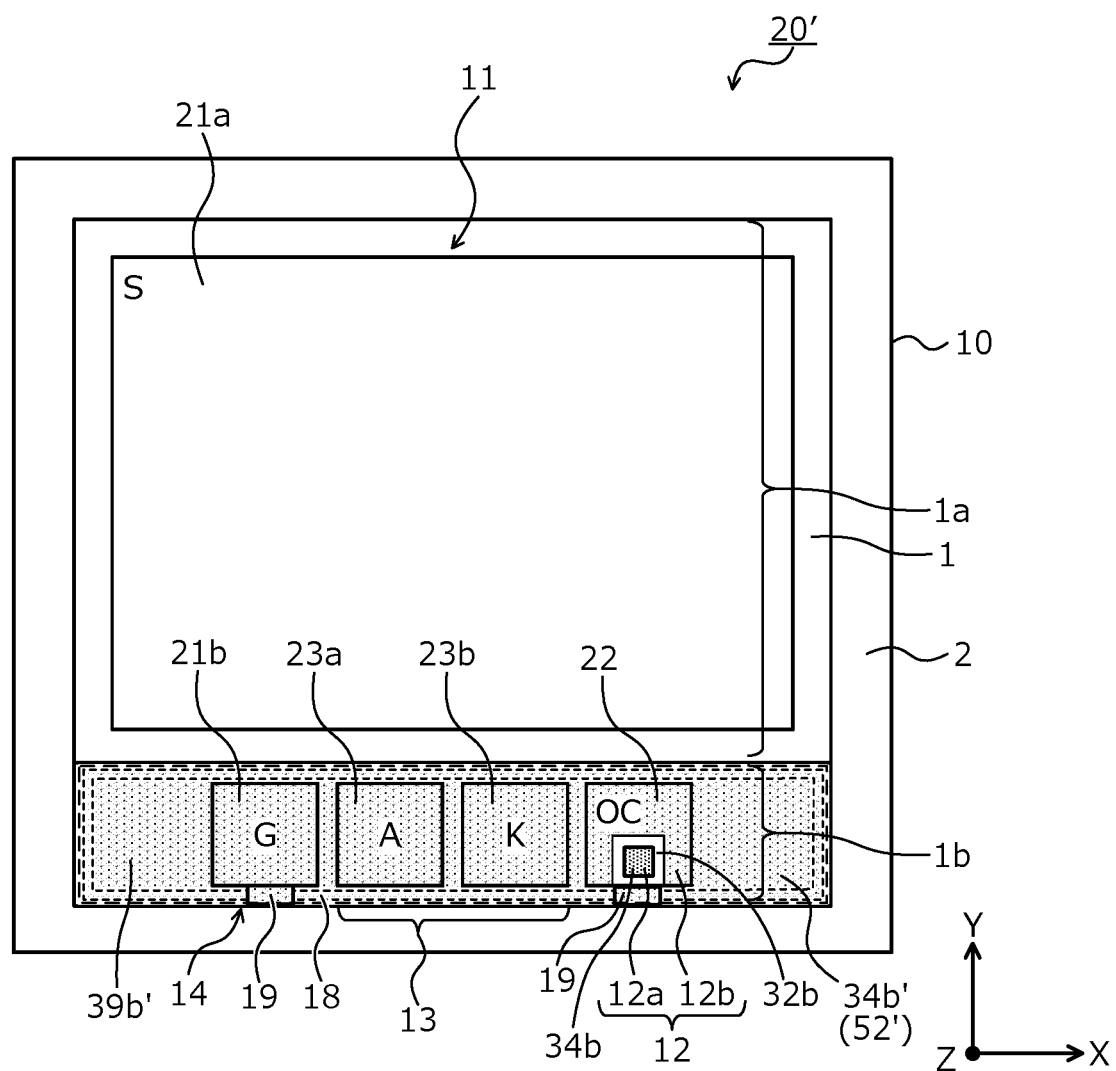
FIG. 14 is a plan view of a layout when a semiconductor device according to a fourth embodiment is viewed from the front side of the semiconductor substrate.

In FIG. 1, a p-type base region (second second-conductivity-type region) 34b of a sensing effective region (second effective region) 12a and extended portions 39b' of gate electrodes 39 of the main non-operating region 1b are indicated by mutually different hatching (similarly in FIGS. 12 to 14). While an outer periphery of a p-type base region 34b' of a main non-operating region 1b is indicated by a dashed line and a slightly smaller rectangle than the outer periphery of the main non-operating region 1b, the outer periphery of the p-type base region 34b' is a same as the outer periphery of the main non-operating region 1b (similarly in FIGS. 12 to 14). An inner periphery of the p-type base region 34b' is a same as an outer periphery of an n⁻-type region 32b.

A semiconductor device 20 according to the first embodiment depicted in FIG. 1 has a main semiconductor element (first insulated gate field effect transistor) 11 and one or more circuit regions for protecting/controlling the main semiconductor element 11, in an active region 1 of a single semiconductor substrate (semiconductor chip) 10. The main semiconductor element 11 is a vertical MOSFET in which a drift current passes in a depth direction Z of the semiconductor substrate 10 during an ON state. The main semiconductor element 11 is configured by plural unit cells (functional units of an element) connected in parallel to one another by a source pad (first source pad) 21a.

The unit cells of the main semiconductor element 11 are disposed adjacent to one another in a direction parallel to a front surface of the semiconductor substrate 10. The main semiconductor element 11 performs a main operation of the semiconductor device 20 according to the first embodiment. The main semiconductor element 11 is disposed in an effective region (main effective region: first effective region) 1a of the active region 1. The main effective region 1a is a region through which a main current of the main semiconductor element 11 flows when the main semiconductor element 11 is ON. The main effective region 1a, for example, has a substantially rectangular planar shape and occupies most of a surface area of the active region 1.

A circuit region for protecting/controlling the main semiconductor element 11, for example, is a high-function region such as a current sensing portion (second insulated gate field effect transistor) 12, a temperature sensing portion 13, an over-voltage protecting portion (not depicted), and an arithmetic circuit portion (not depicted), disposed in the main non-operating region 1b of the active region 1. The main non-operating region 1b is a region in which none of the unit cells of the main semiconductor element 11 are disposed and does not function as the main semiconductor element 11. The main non-operating region 1b, for example, has a substantially rectangular planar shape and is disposed between the main effective region 1a and an edge termination region 2.

The edge termination region 2 is a region between the active region 1 and an end of the semiconductor substrate 10; the edge termination region 2 surrounds a periphery of the active region 1, mitigates electric field at a front side of the semiconductor substrate 10, and sustains a breakdown voltage. In the edge termination region 2, for example, a voltage withstanding structure (not depicted) such as a field limiting ring (FLR) or a junction termination extension (JTE) structure is disposed. The breakdown voltage is a voltage limit at which no errant operation or destruction of an element occurs.

The source pad (electrode pad) 21a of the main semiconductor element 11 is disposed on the front surface of the semiconductor substrate 10, in the main effective region 1a. The main semiconductor element 11 has a large current capacity as compared to other circuit regions. Therefore, the source pad 21a of the main semiconductor element 11 has a substantially same planar shape as that of the main effective region 1a and covers substantially an entire area of the main effective region 1a. The source pad 21a of the main semiconductor element 11 is disposed to be separate from other electrode pads excluding the source pad 21a.

The other electrode pads excluding the source pad 21a are disposed on the front surface of the semiconductor substrate 10 in the main non-operating region 1b, to be separate from the edge termination region 2 and to be separate from each other. The other electrode pads excluding the source pad 21a are a gate pad 21b of the main semiconductor element 11, an electrode pad (hereinafter, OC pad (second source pad) 22 of the current sensing portion 12, electrode pads (hereinafter, anode pad and cathode pad) 23a, 23b of the temperature sensing portion 13, an electrode pad (hereinafter, OV pad, not depicted) of the over-voltage protecting portion, and an electrode pad (not depicted) of the arithmetic circuit portion.

The other electrode pads excluding the source pad 21a, for example, have a substantially rectangular planar shape and have a surface area for bonding terminal pins 48b to 48e described hereinafter and wiring. In FIG. 1, a case is depicted in which the other electrode pads excluding the source pad 21a are disposed in a row along a border between the main non-operating region 1b and the edge termination region 2 (similarly in FIGS. 12 to 14). Further, in FIG. 1, the source pad 21a, the gate pad 21b, the OC pad 22, the anode pad 23a, and the cathode pad 23b are depicted in rectangular shapes appended with "S", "G", "OC", "A", and "K", respectively (similarly in FIGS. 12 to 14).

The current sensing portion 12 operates under conditions similar to those of the main semiconductor element 11 and has a function of detecting overcurrent (OC) flowing in the main semiconductor element 11. The current sensing portion 12 is disposed to be separate from the main semiconductor element 11. The current sensing portion 12 is a vertical MOSFET that includes unit cells each having a configuration similar to a configuration of the main semiconductor element 11, of a quantity (for example, about 10) fewer than a quantity (for example, at least about 1000) of the unit cells of the main semiconductor element 11; the current sensing portion 12 has a surface area smaller than that of the main semiconductor element 11.

The unit cells of the current sensing portion 12 are disposed in a region (hereinafter, sensing effective region) 12a that is a portion of a region of the semiconductor substrate 10 covered by the OC pad 22. The sensing effective region 12a, for example, has a rectangular planar shape. The unit cells of the current sensing portion 12 are disposed to be adjacent to one another in a direction parallel to the front surface of the semiconductor substrate 10. The direction in which the unit cells of the current sensing portion 12 are adjacent to one another, for example, is a same direction as that in which the unit cells of the main semiconductor element 11 are adjacent to one another. The unit cells of the current sensing portion 12 are connected to one another by the OC pad 22.

Further, in the region of the semiconductor substrate 110 covered by the OC pad 22, a region excluding the sensing effective region 12a is a sensing non-operating region 12b that does not function as the current sensing portion 12. In the sensing non-operating region 12b, none of the unit cells of the current sensing portion 12 are disposed. In substantially an entire area of the sensing non-operating region 12b, the p-type base region 34b' is provided at a surface region of the front surface of the semiconductor substrate 10. The p-type base region 34b' is disposed to be separate from the sensing effective region 12a and surrounds a periphery of the sensing effective region 12a in a substantially rectangular shape.

The p-type base region 34b', for example, extends spanning substantially an entire area of a region of the main non-operating region 1b excluding the sensing effective region 12a and is disposed directly beneath the other electrode pads excluding the source pad 21a. When a voltage that is negative with respect to a source electrode (the source pad 21a) of the main semiconductor element 11 is applied to a drain electrode 51, a p-type region (third second-conductivity-type region) 52' configured by the p-type base region 34b' and a second p$^+$-type region 62b' described hereinafter (refer to FIGS. 2 to 4) sustains a predetermined breakdown voltage of the main non-operating region 1b by a pn junction formed with an n$^-$-type drift region (first first-conductivity-type region) 32.

While not depicted in FIG. 1, an n-type region 53' described hereinafter and a p-type region 54' are disposed between the p-type region 52' and the front surface of the semiconductor substrate 10 (refer to FIGS. 2 to 4). By the n-type region (second first-conductivity-type region) 53' and the p-type region (fourth second-conductivity-type region) 54', as described hereinafter, configuration is such that when a voltage that is negative with respect to the source electrode of the main semiconductor element 11 is applied to the drain electrode 51, electric field is not applied to extended portions 38b' of gate insulating films 38b described hereinafter, on the front surface of the semiconductor substrate 10.

The p-type region 52' may have a floating (floating electric potential) (not depicted), or may be connected to a p-type base region (first second-conductivity-type region) 34a of the main semiconductor element 11 and fixed at a source electric potential of the main semiconductor element 11. When the p-type region 52' is fixed at the source electric potential of the main semiconductor element 11, a parasitic diode 16 (16b) of the main semiconductor element 11 is formed by a pn junction between the p-type region 52' and the n$^-$-type drift region 32.

A non-depicted n$^-$-type region of a surface region of the semiconductor substrate 10 separates the p-type region 52' and a p-type region for element separation (not depicted). The p-type region for element separation is disposed in the edge termination region 2, in a substantially rectangular shape surrounding a periphery of the active region 1 and is a floating p-type region that forms a parasitic diode that electrically separates the active region 1 and the edge termination region 2; the p-type region for element separation forms the parasitic diode by a pn junction with the n$^-$-type drift region 32.

Separation of the p-type region 52' and the p-type region for element separation enables positive hole current to be suppressed from concentrating in the current sensing portion 12; the positive hole current flows to the main non-operating region 1b from a back side of the semiconductor substrate 10 and is generated in the n$^-$-type drift region 32 of the edge termination region 2 when the parasitic diode 16b described hereinafter formed in the main non-operating region 1b of the active region 1 turns OFF. As a surface area of the p-type region 52' is increased, forward voltage (voltage drop) of the parasitic diode 16b may be increased.

Further, the n$^-$-type region (fourth first-conductivity-type region) 32b separates the p-type base region 34b' and a p-type base region 34b of the sensing effective region 12a. The n$^-$-type region 32b is disposed between the p-type base region 34b' of the sensing non-operating region 12b and the p-type base region 34b of the sensing effective region 12a and surrounds a periphery of the sensing effective region 12a in a substantially rectangular shape. A distance w1 between the p-type base region 34b' of the sensing non-operating region 12b and the p-type base region 34b of the sensing effective region 12a may be as small as possible and is, for example, at least 0.1 µm.

A reason for this is as follows. As the distance w1 between the p-type base region 34b' of the sensing non-operating region 12b and the p-type base region 34b of the sensing effective region 12a increases, a surface area of the n$^-$-type region 32b disposed between the p-type base regions 34b', 34b increases. In an interlayer insulating film 40, electric field locally concentrates at parts covered by the n$^-$-type region 32b, whereby the breakdown voltage decreases and therefore, when the distance w1 is as small as possible and the surface area of the n$^-$-type region 32b is as small as possible, decreases in the breakdown voltage in the main non-operating region 1b may be suppressed.

The gate insulating films 38b and the gate electrodes 39b (refer to FIGS. 2 to 4) of the current sensing portion 12 extend spanning substantially an entire area of the front surface of the semiconductor substrate 10 in the main non-operating region 1b, from inside trenches 37a of the sensing effective region 12a, to be disposed directly beneath all electrode pads in the main non-operating region 1b. In this manner, in the main non-operating region 1b, the gate insulating films 38b and the gate electrodes 39b of the current sensing portion 12 extend on the front surface of the semiconductor substrate 10 and no field insulating film is provided.

By portions (hereinafter, extended portions) 38b', 39b' of the gate insulating films 38b and the gate electrodes 39b of the current sensing portion 12, extending on the front surface of the semiconductor substrate 10 on the main non-operating region 1b, a planar gate structure (planar gate structure) of a gate potential of the current sensing portion 12 is configured on the front surface of the semiconductor substrate 10 in the main non-operating region 1b. The extended portions 39b' of the gate electrodes 39b of the current sensing portion 12 are electrically insulated from all of the electrode pads of the main non-operating region 1b and barrier metals 46b, 46e by the interlayer insulating film 40.

In this manner, the planar gate structure of the gate potential of the current sensing portion 12 are disposed, whereby a gate capacitance of the current sensing portion 12 is a sum of a gate capacitance formed by trench gate structures in trenches 37b and a gate capacitance formed by the planar gate structure on the front surface of the semiconductor substrate 10 in the main non-operating region 1b. Therefore, as compared to a conventional structure (refer to FIGS. 16 to 19), the gate capacitance of the current sensing portion 12 may be increased and the ESD capability of the current sensing portion 12 may be enhanced.

The temperature sensing portion 13 has a function of detecting a temperature of the main semiconductor element 11 by using diode temperature characteristics. The temperature sensing portion 13 is disposed directly beneath the anode pad 23a and the cathode pad 23b. The temperature sensing portion 13, for example, may be configured by a polysilicon (poly-Si) layer provided on the interlayer insulating film 40 of the front surface of the semiconductor substrate 10 or may be formed by a pn junction between a p-type region and an n-type region formed in the semiconductor substrate 10.

The over-voltage protecting portion (not depicted), for example, is a diode that protects the main semiconductor element 11 from overvoltage (OV) such as surges. The current sensing portion 12, the temperature sensing portion 13, and the over-voltage protecting portion are controlled by the arithmetic circuit portion. The main semiconductor element 11 is controlled based on signals output by the current sensing portion 12, the temperature sensing portion 13, and the over-voltage protecting portion. The arithmetic circuit portion is configured by plural semiconductor elements such as complementary MOS (CMOS) circuits.

A cross-section of a structure of the active region 1 of the semiconductor device 20 according to the first embodiment will be described. FIGS. 2, 3, and 4 are cross-sectional views of the structure of the active region in FIG. 1. FIG. 2 depicts a cross-section (cross-section along cutting line X1-X2-X3-X4-X5) of the structure of the main effective region 1a and the current sensing portion 12. FIG. 3 depicts a cross-section (cross-section along cutting line X1-X2-X3 and cutting line Y1-Y2) of the structure of the main effective region 1a, the sensing non-operating region 12b, and the temperature sensing portion 13.

Figure 3:
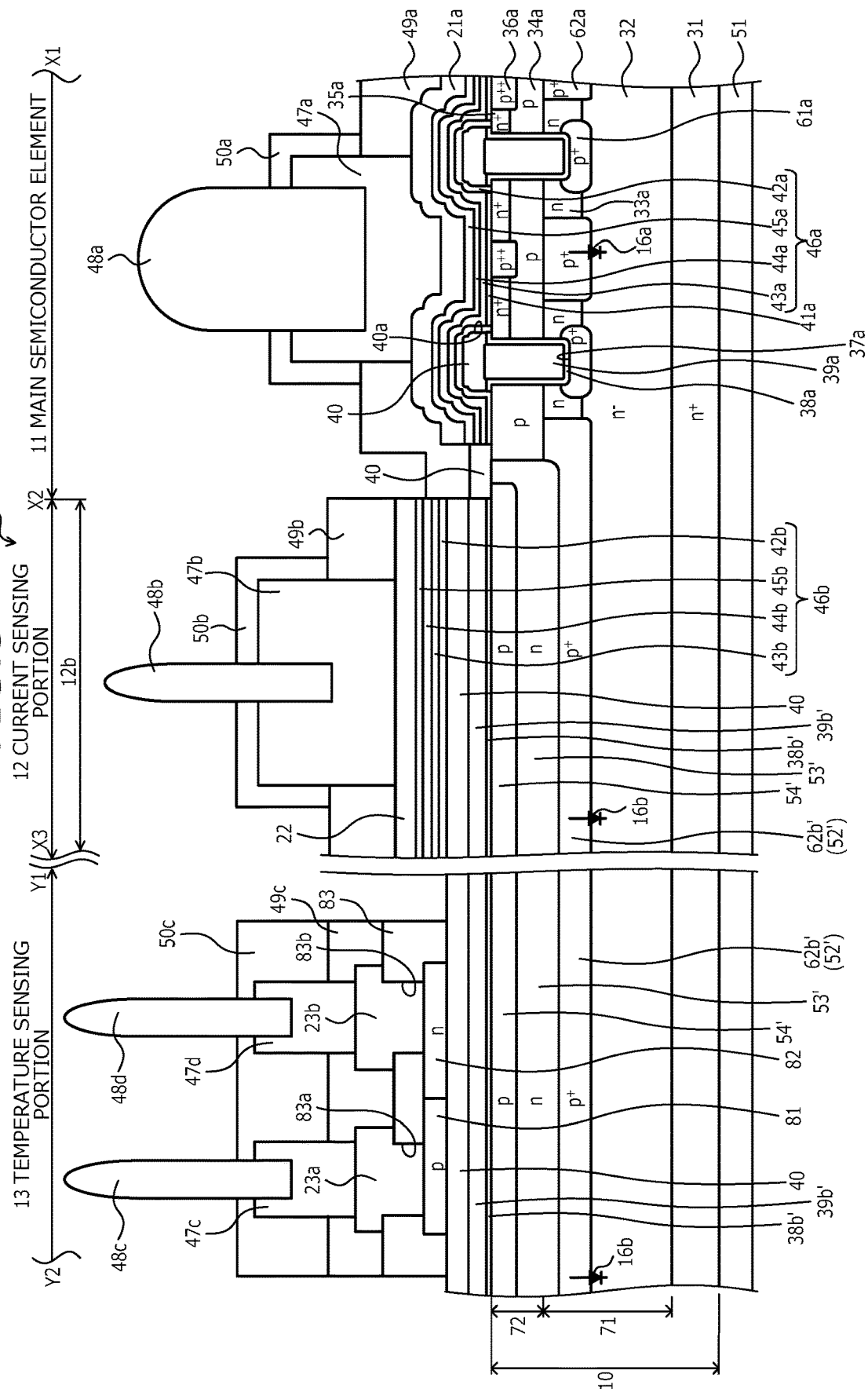
FIG. 3 is a cross-sectional view of the structure of the active region in FIG. 1.
Figure 4:
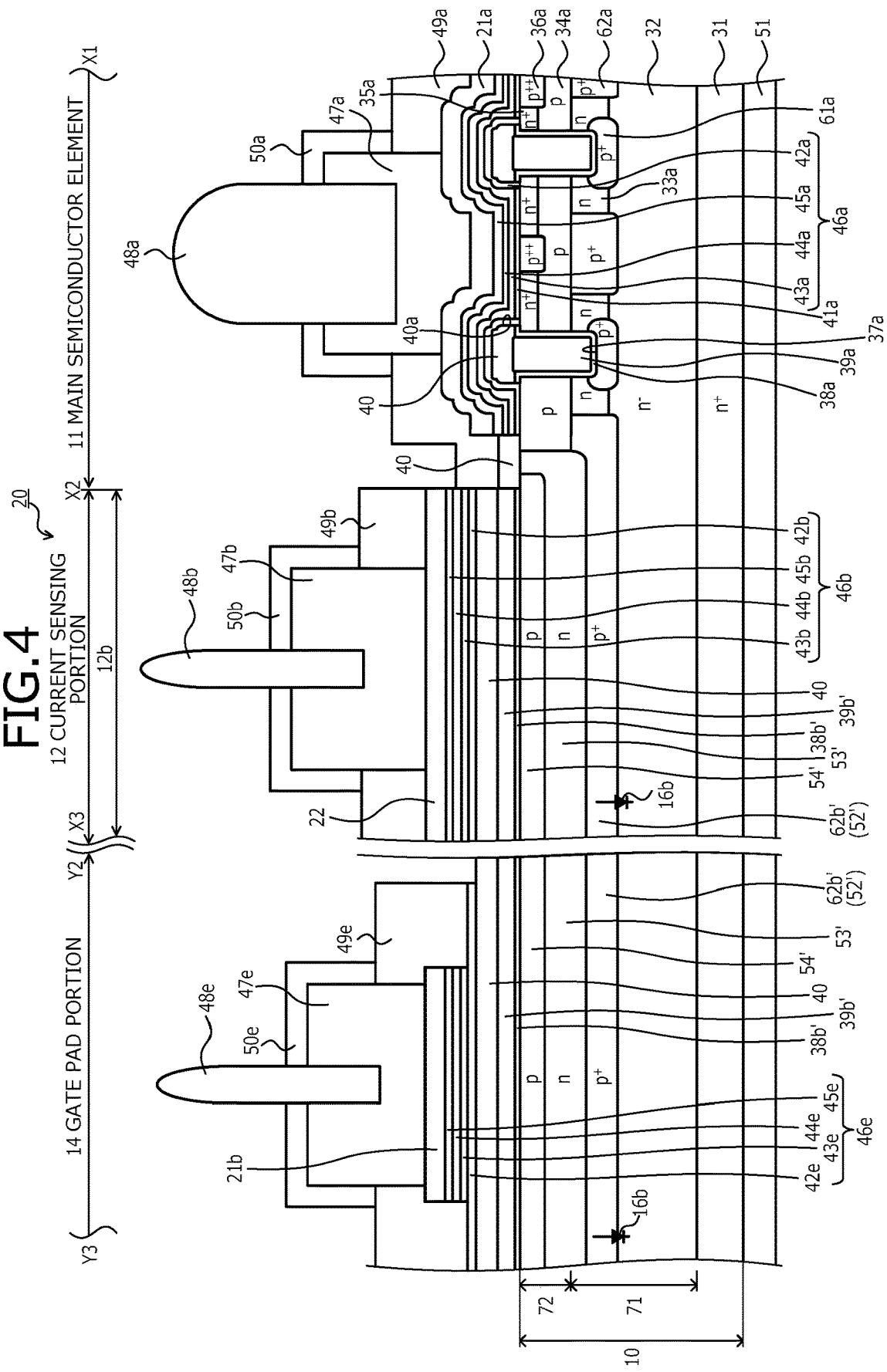
FIG. 4 is a cross-sectional view of the structure of the active region in FIG. 1.

FIG. 4 depicts a cross-section (cross-section along cutting line X1-X2-X3 and cutting line Y2-Y3) of the main effective region 1a, the sensing non-operating region 12b, and a gate pad portion 14. While FIGS. 3 and 4 do not depict the sensing effective region 12a, a cross-section of the structure of the sensing effective region 12a is similar to a cross-section of the structure along cutting line X4-X5 in FIG. 2. While FIGS. 2 to 4 depict only a portion of the respective unit cells of the main effective region 1a and the sensing effective region 12a, the unit cells of the main effective region 1a and the sensing effective region 12a all have the same structure.

The main semiconductor element 11 is a vertical MOSFET that includes MOS gates (insulated gates having a 3-layer structure including a metal, an oxide film, and a semiconductor) at the front side of the semiconductor substrate 10, in the main effective region 1a. Here, as an example, a case in which the main semiconductor element 11 and the circuit regions that protect/control the main semiconductor element 11 have wiring structures of similar configurations that use pin-shaped wiring members (the terminal pins 48a to 48e described hereinafter) has been described; however, instead of the pin-shaped wiring members, the wiring structure may use wires.

The semiconductor substrate 10 is an epitaxial substrate in which silicon carbide layers 71, 72 forming the n$^-$-type drift region 32 and the p-type base region 34a are sequentially formed by epitaxial growth on a front surface of an n$^+$-type starting substrate 31 containing silicon carbide. The main semiconductor element 11 has general MOS gates configured by the p-type base region 34a, n$^+$-type source regions 35a, p$^{++}$-type contact regions 36a, the trenches 37a, gate insulating films 38a, and the gate electrodes 39a provided at the front side of the semiconductor substrate 10.

The trenches 37a penetrate through the p-type silicon carbide layer 72 from the front surface of the semiconductor substrate 10 (surface of the p-type silicon carbide layer 72) in the depth direction Z and reach the n$^-$-type silicon carbide layer 71. The trenches 37a, for example, may be disposed in a striped pattern extending in a direction parallel to the front surface of the semiconductor substrate 10 or may be disposed in a matrix-like pattern as viewed from the front side of the semiconductor substrate 10. In FIGS. 2 to 4, the trenches 37a are depicted in a striped pattern extending in a first direction X (refer to FIG. 1) along which the electrode pads 21b, 23a, 23b, 22 are arranged. Reference character Y is a direction that is parallel to the front surface of the semiconductor chip and orthogonal to the first direction.

In the trenches 37a, the gate electrodes 39a are provided via the gate insulating film 38a. Between (mesa region) each pair of the trenches 37a adjacent to one another, the p-type base region 34a, the $n^+$-type source regions 35a, and the $p^{++}$-type contact regions 36a are selectively provided at surface regions of the front surface of the semiconductor substrate 10. The $n^+$-type source regions 35a and the $p^{++}$-type contact regions 36a are provided between the front surface of the semiconductor substrate 10 and the p-type base region 34a. The $n^+$-type source regions 35a are provided closer to the trenches 37a than are the $p^{++}$-type contact regions 36a.

The $n^+$-type source regions 35a are not disposed at an end portion of the main effective region 1a. As a result, at the end portion of the main effective region 1a, the source electrode of the main semiconductor element 11 is electrically connected to only the p-type base region 34a. Therefore, operation of a parasitic npn transistor of the end portion of the main effective region 1a and formed by one of the $n^+$-type source regions 35a, the p-type base region 34a, and the $n^-$-type drift region 32 (or an n-type current spreading region 33a described hereinafter) may be prevented.

The end portion of the main effective region 1a is a portion of the main effective region 1a closer to the end of the semiconductor substrate 10 in the second direction Y than is an outermost trench 37a that is closest to the end of the semiconductor substrate 10 among the trenches 37a and is a portion that is closer to the end of the semiconductor substrate 10 in the first direction X than are ends of the trenches 37a. The $p^{++}$-type contact regions 36a may be omitted. In a case in which the $p^{++}$-type contact regions 36a are omitted, at a position further from the trenches 37a than are the $n^+$-type source regions 35a, the p-type base region 34a reaches the front surface of the semiconductor substrate 10 and is exposed at the front surface of the semiconductor substrate 10.

In the semiconductor substrate 10, at a position closer to an $n^+$-type drain region (the $n^+$-type starting substrate 31: third first-conductivity-type region) than is the p-type base region 34a, the $n^-$-type drift region 32 is provided in contact with the p-type base region 34a. The n-type current spreading regions 33a may be provided between and in contact with the p-type base region 34a and the n-type drift region 32. The n-type current spreading regions 33a are a so-called current spreading layer (CSL) that reduces carrier spreading resistance.

Further, in the semiconductor substrate 10, at a position closer to the $n^+$-type drain region than is the p-type base region 34a, the first and the second $p^+$-type regions 61a, 62a may be provided. The first $p^+$-type regions 61a are each disposed to be separate from the p-type base region 34a and to face a bottom of a corresponding one of the trenches 37 in the depth direction Z. The second $p^+$-type regions 62a are each disposed in a mesa region to be separate from the first $p^+$-type regions 61a and the trenches 37a, and to be in contact with the p-type base region 34a. The first and the second $p^+$-type regions 61a, 62a have a function of mitigating electric field applied to the bottoms of the trenches 37a.

The interlayer insulating film 40 is provided at an entire area of the front surface of the semiconductor substrate 10 and covers the gate electrodes 39a. All of the gate electrodes 39a of the main semiconductor element 11 are electrically connected to the gate pad 21b (refer to FIG. 1) at a non-depicted portion, via a gate runner (not depicted). The gate runner is provided on the front surface of the semiconductor substrate, in the edge termination region 2 via the interlayer insulating film 40 and is a gate polysilicon layer that surrounds a periphery of the active region 1 in a substantially rectangular shape.

In first contact holes 40a that penetrate through the interlayer insulating film 40 in the depth direction Z and reach the semiconductor substrate 10, the $n^+$-type source regions 35a and the $p^{++}$-type contact regions 36a of the main semiconductor element 11 are exposed. On the front surface of the semiconductor substrate 10, nickel silicide (NiSi, $Ni_2Si$, or thermally stable $NiSi_2$: hereinafter, collectively "NiSi") films 41a are provided in the first contact holes 40a, respectively.

The NiSi films 41a, in the first contact holes 40a, form ohmic contacts with the semiconductor substrate 10, and are electrically connected to the $n^+$-type source regions 35a and the $p^{++}$-type contact regions 36a. In a case where the $p^{++}$-type contact regions 36a are not provided, instead of the $p^{++}$-type contact regions 36a, the p-type base region 34a is exposed in the first contact holes 40a and is electrically connected to the NiSi films 41a.

In the main effective region 1a, at an entire area of the surfaces of the interlayer insulating film 40 and the NiSi films 41a, a barrier metal 46a is provided. The barrier metal 46a has a function of preventing interaction between metal films of the barrier metal 46a or between regions that face each other across the barrier metal 46a. The barrier metal 46a, for example, may have a stacked structure in which a first titanium nitride (TiN) film 42a, a first titanium (Ti) film 43a, a second titanium film 44a, and a second Ti film 45a are sequentially stacked.

The first TiN film 42a is provided only at the surface of the interlayer insulating film 40 and covers an entire area of the surface of the interlayer insulating film 40. The first titanium film 43a is provided at surfaces of the first TiN film 42a and the NiSi films 41a. The second titanium film 44a is provided at a surface of the first titanium film 43a. The second Ti film 45a is provided at a surface of the second titanium film 44a. The barrier metal, for example, is not provided in the temperature sensing portion 13.

The source pad 21a is embedded in the first contact holes 40a and provided at an entire area of the surface of the second Ti film 45a. The source pad 21a is electrically connected to the $n^+$-type source regions 35a and the p-type base region 34a, via the barrier metal 46a and the NiSi films 41a; and functions as the source electrode of the main semiconductor element 11. The source pad 21a is, for example, an aluminum (Al) film or an Al alloy film having a thickness of about 5 μm.

In particular, when the source pad 21a is an Al alloy film, the source pad 21a, for example, may be an aluminum-silicon (Al—Si) film containing at most about 5% silicon in total, or may be an aluminum-silicon-copper (Al—Si—Cu) film containing at most about 5% silicon in total and at most about 5% copper (Cu) in total, or may be an aluminum-copper (Al—Cu) film containing at most about 5% copper in total.

First ends of the terminal pins 48a are bonded on the source pad 21a, via plating films 47a and solder layers (not depicted). Second ends of the terminal pins 48a are bonded to a metal bar (not depicted) disposed so as to face the front surface of the semiconductor substrate 10. Further, the second ends of the terminal pins 48a are exposed outside a case (not depicted) in which the semiconductor substrate 10 is mounted and the second ends are electrically connected to an external device (not depicted). The terminal pins 48a are wiring members having a round, rod-like shape (cylinder shape) of a predetermined diameter.

The terminal pins 48a are soldered to the plating films 47a in a substantially upright state with respect to the front surface of the semiconductor substrate 10. The terminal pins 48a are external connection terminals that lead out electric potential of the source pad 21a and are connected to an external ground potential (minimum electric potential). Portions of the surface of the source pad 21a other than portions having the plating films 47a are covered by first protective films 49a, and borders between the plating films 47a and the first protective films 49a are covered by second protective films 50a. The first and the second protective films 49a, 50a, for example, are polyimide films.

The drain electrode 51 forms an ohmic contact with an entire area of a back surface of the semiconductor substrate 10 (back surface of the $n^+$-type starting substrate 31). On the drain electrode 51, a drain pad (electrode pad, not depicted) having a stacked structure in which, for example, a Ti film, a nickel (Ni) film, and a gold (Au) film are sequentially stacked is provided. The drain pad is soldered to a metal base plate (not depicted) and at least a portion of the drain pad is in contact with a base part of a cooling fin (not depicted) via the metal base plate.

In this manner, the terminal pins 48a are bonded to the front surface of the semiconductor substrate 10 and the back surface is bonded to the metal base plate, whereby the semiconductor device 20 according to the first embodiment has a double-sided cooling structure in which a cooling structure is provided on both sides of the semiconductor substrate 10. In other words, heat generated by the semiconductor substrate 10 is radiated from a fin portion of the cooling fin in contact with the back surface of the semiconductor substrate 10 via the metal base plate and is radiated from the metal bar to which the terminal pins 48a of the front surface of the semiconductor substrate 10 are bonded.

The current sensing portion 12 includes the p-type base region 34b, $n^+$-type source regions 35b, $p^{++}$-type contact regions 36b, the trenches 37b, the gate insulating films 38b, the gate electrodes 39b, and the interlayer insulating film 40 respectively having configurations similar to configurations of corresponding parts of the main semiconductor element 11. Parts of the MOS gates of the current sensing portion 12 are provided in the sensing effective region 12a of the main non-operating region 1b. The p-type base region 34b of the current sensing portion 12 is configured by the p-type silicon carbide layer 72 similarly to the p-type base region 34a of the main semiconductor element 11.

In end portions of the sensing effective region 12a, a $p^+$-type region 63b is provided between the p-type base region 34b and the $n^-$-type drift region 32, and is in contact with the p-type base region 34b and the $n^-$-type drift region 32. The end portions of the sensing effective region 12a is a portion of the sensing effective region 12a closer to a border of the sensing effective region 12a in the second direction Y than is an outermost trench 37b that is closest to the border of the sensing effective region 12a among the trenches 37b, is a portion of the sensing effective region 12a closer to a border of the sensing effective region 12a in the first direction X than are ends of the trenches 37b, and in the sensing effective region 12a, is a portion covered by the extended portions 38b' of the gate insulating films 38b.

A p-type region 52 that is configured by the p-type base region 34b and the $p^+$-type region 63b is provided in an outer periphery portion of the sensing effective region 12a, along an outer periphery of the sensing effective region 12a and the p-type region 52 surrounds a periphery of a center portion of the sensing effective region 12a. All of the unit cells of the current sensing portion 12 are at a side of the p-type region 52, the side nearest the center portion of the sensing effective region 12a. The p-type region 52 sustains a predetermined breakdown voltage near the end portions of the sensing effective region 12a by a pn junction formed with the $n^-$-type drift region 32, when a voltage that is negative with respect to the source electrode (the OC pad 22) of the current sensing portion 12 is applied to the drain electrode 51.

An n-type region 53 is selectively provided between the p-type region 52 and the front surface of the semiconductor substrate 10, so as to be in contact with the p-type region 52 and to be exposed at the front surface of the semiconductor substrate 10. A p-type region 54 is selectively provided between the n-type region 53 and the front surface of the semiconductor substrate 10, so as to be in contact with the n-type region 53 and exposed at the front surface of the semiconductor substrate 10. The n-type region 53 and the p-type region 54 may be in contact with the gate insulating films 38b of the sensing effective region 12a, at an outermost side wall of the outermost trench 37b of the trenches 37b in the second direction Y and at side walls of the trenches 37b in the first direction X.

The p-type region 52, the n-type region 53, and the p-type region 54 face the extended portions 39b' of the gate electrodes 39b in the depth direction Z, across the extended portions 38b' of the gate insulating films 38b of the current sensing portion 12. In other words, a pn junction between the p-type region 54 and the n-type region 53 is formed directly beneath the extended portions 39b' of the gate electrodes 39b, between the front surface of the semiconductor substrate 10 and the p-type region 52. The pn junction between the p-type region 54 and the n-type region 53 enables enhancement of dielectric breakdown voltage of the extended portions 38b' of the gate insulating films 38b at the end portions of the sensing effective region 12a. A reason for this is as follows.

When a voltage that is negative with respect to the source electrode of the current sensing portion 12 is applied to the drain electrode 51, displacement current from the current sensing portion 12 flows into the end portions of the sensing effective region 12a and therefore, electric field is not applied to the extended portions 38b' of the gate insulating films 38b on the front surface of the semiconductor substrate 10 at the end portions of the sensing effective region 12a. Accordingly, on the front surface of the semiconductor substrate 10 at the end portions of the sensing effective region 12a, even when the extended portions 38b' of the gate insulating films 38b having a thickness that is thin as compared to that of the field insulating film 180 of the conventional structure (refer to FIGS. 17 to 19) is disposed, dielectric breakdown does not occur at the extended portions 38b' of the gate insulating films 38b.

The current sensing portion 12, similarly to the main semiconductor element 11, may have n-type current spreading regions 33b, and first and second $p^+$-type regions 61b, 62b. In FIG. 2, one unit cell of the current sensing portion 12 is depicted in the sensing effective region 12a (similarly in FIG. 15). The $p^{++}$-type contact regions 36b may be omitted. The gate electrodes 39b of the current sensing portion 12 are electrically connected to the gate pad 21b, via the gate runner (not depicted) (refer to FIG. 1). The gate electrodes 39b of the current sensing portion 12 is covered by the interlayer insulating film 40.

In the sensing effective region 12a, second contact holes 40b are provided in the interlayer insulating film 40, penetrating the interlayer insulating film 40 in the depth direction Z and reaching the semiconductor substrate 10. In the second contact holes 40$b$, the n$^+$-type source regions 35$b$ and the p$^{++}$-type contact regions 36$b$ of the current sensing portion 12 are exposed. In the second contact holes 40$b$, similarly to the main semiconductor element 11, NiSi films 41$b$ are provided electrically connected to the n$^+$-type source regions 35$b$ and the p$^{++}$-type contact regions 36$b$.

In a case where the p$^{++}$-type contact regions 36$b$ are omitted, instead of the p$^{++}$-type contact regions 36$b$, the p-type base region 34$b$ is exposed in the second contact holes 40$b$ and is electrically connected to the NiSi films 41$b$. In the sensing effective region 12$a$, at an entire area of the surface of the interlayer insulating film 40 and an entire area of the surfaces of the NiSi films 41$b$, similarly to the main semiconductor element 11, the barrier metal 46$b$ is provided. Reference numerals 42$b$ to 45$b$ are respectively a first TiN film, a first Ti film, a second TiN film, and a second Ti film configuring the barrier metal 46$b$.

The OC pad 22 is provided at an entire area of the surface of the barrier metal 46$b$ so as to be embedded in the second contact holes 40$b$. The OC pad 22 is electrically connected to the n$^+$-type source regions 35$b$ and the p-type base region 34$b$ of the current sensing portion 12 via the barrier metal 46$b$ and the NiSi films 41$b$. The OC pad 22 functions as the source electrode of the current sensing portion 12. The OC pad 22, for example, is formed using a material similar to that of the source pad 21$a$.

In the sensing non-operating region 12$b$ of the main non-operating region 1$b$, the p-type base region 34$b'$ is provided at a surface region of the front surface of the semiconductor substrate as described above. The p-type base region 34$b'$ is configured by the p-type silicon carbide layer 72, similarly to the p-type base region 34$a$ of the main semiconductor element 11. The p-type base region 34$b'$ is disposed between the p-type region for element separation (not depicted), the p-type base region 34$a$ of the main semiconductor element 11, and the p-type base region 34$b$ of the current sensing portion 12.

The p-type base region 34$b'$, as described above, surrounds a periphery of the p-type base region 34$b$ of the current sensing portion 12 across the n-type region 32$b$; the n$^-$-type region 32$b$ separates the p-type base region 34$b'$ and the p-type base region 34$b$ of the current sensing portion 12; and the non-depicted n$^-$-type region separates the p-type base region 34$b'$ and the p-type region for element separation. The n$^-$-type region 32$b$, for example, is a diffusion region that penetrates through the p-type silicon carbide layer 72 in the depth direction Z and reaches the n$^-$-type silicon carbide layer 71, and is provided at a surface region of the front surface of the semiconductor substrate 10.

The second p$^+$-type region 62$b'$ is provided between and in contact with the p-type base region 34$b'$ and the n$^-$-type drift region 32. The p-type region 52$'$ that is formed by the p-type base region 34$b'$ and the second p$^+$-type region 62$b'$ extends from directly beneath the OC pad 22 and spans substantially an entire area of a region of the main non-operating region 1$b$, excluding the sensing effective region 12$a$. The p-type region 52 may be floating (not depicted), or may be connected to the p-type base region 34$a$ of the main semiconductor element 11 and fixed at the source electric potential of the main semiconductor element 11.

The p-type region 52$'$ sustains a predetermined breakdown voltage of the main non-operating region 1$b$ by a pn junction formed with the n$^-$-type drift region 32 when a voltage that is negative with respect to the source electrode of the main semiconductor element 11 is applied to the drain electrode 51. Further, while the p-type region 52$'$ is disposed to be separate from the p-type region 52 of the current sensing portion 12, the p-type region 52$'$ is electrically connected to the p-type region 52 of the current sensing portion 12 by built-in potential. Therefore, a predetermined breakdown voltage near the n$^-$-type region 32$b$ between the p-type regions 52, 52$'$ is also sustained by pn junctions between the p-type regions 52, 52$'$ and the n$^-$-type drift region 32.

The n-type region 53$'$ is selectively provided between the p-type region 52$'$ and the front surface of the semiconductor substrate 10, to be in contact with the p-type region 52$'$ and exposed at the front surface of the semiconductor substrate 10. The n-type region 53$'$ may reach a position deeper from the front surface of the semiconductor substrate 10 than is the p-type base region 34$b'$. An end portion of the n-type region 53$'$ nearest the sensing effective region 12$a$ terminates at a position further from the sensing effective region 12$a$ than is an end portion of the p-type region 52$'$ nearest the sensing effective region 12$a$, and is not in contact with the n$^-$-type region 32$b$. The p-type region 54$'$ is selectively provided between the n-type region 53$'$ and the front surface of the semiconductor substrate 10, to be in contact with the n-type region 53$'$ and exposed at the front surface of the semiconductor substrate 10.

Between the p-type region 54$'$ and the p-type region 52$'$, the n-type region 53$'$ is in contact with an entire area of the surface of the p-type region 54$'$ and the p-type region 54$'$ is not in contact with the p-type region 52$'$. The n-type region 53$'$ and the p-type region 54$'$ extend from directly beneath the OC pad 22, to span substantially an entire area of a region of the main non-operating region 1$b$, excluding the sensing effective region 12$a$. The n-type region 53$'$ and the p-type region 54$'$ may extend in the main effective region 1$a$ to an extent of not being electrically connected to the NiSi films 41$a$, the barrier metal 46$a$, and the source pad 21$a$ of the main semiconductor element 11.

The p-type region 52$'$, the n-type region 53$'$, and the p-type region 54$'$ face the extended portions 39$b'$ of the gate electrodes 39$b$ in the depth direction Z, across the extended portions 38$b'$ of the gate insulating films 38$b$ of the current sensing portion 12. In other words, directly beneath the extended portions 39$b'$ of the gate electrodes 39$b$, a pn junction between the p-type region 54$'$ and the n-type region 53$'$ is formed between the front surface of the semiconductor substrate 10 and the p-type region 52$'$. The pn junction between the p-type region 54$'$ and the n-type region 53$'$ enables dielectric breakdown voltage of the extended portions 38$b'$ of the gate insulating films 38$b$ to be enhanced. A reason for this is as follows.

When a voltage that is negative with respect to the source electrode of the main semiconductor element 11 is applied to the drain electrode 51, displacement current from the main semiconductor element 11 flows into the main non-operating region 1$b$ and therefore, electric field is not applied to the extended portions 38$b'$ of the gate insulating films 38$b$ on the front surface of the semiconductor substrate 10 in the main non-operating region 1$b$. Accordingly, on the front surface of the semiconductor substrate 10 in the main non-operating region 1$b$, even when the extended portions 38$b'$ of the gate insulating films 38$b$ having a thickness that is thin as compared to that of the field insulating film 180 of the conventional structure is disposed, dielectric breakdown does not occur at the extended portions 38$b'$ of the gate insulating films 38$b$.

In a region of the main non-operating region 1$b$, excluding the sensing effective region 12$a$, the gate insulating films 38$b$ and the gate electrodes 39$b$ of the current sensing portion 12 extend on substantially an entire area of the surface of the front surface of the semiconductor substrate 10 from inside the trenches 37a of the sensing effective region 12a. The planar gate structure of the gate potential of the current sensing portion 12 is configured on the front surface of the semiconductor substrate 10 in the main non-operating region 1b, as described above, by the extended portions 38b', 39b' of the gate insulating films 38b and the gate electrodes 39b of the current sensing portion 12, the extended portions 38b', 39b' extending on the front surface of the semiconductor substrate 10 in the main non-operating region 1b.

The planar gate structure of the gate potential of the current sensing portion 12 is disposed between the front surface of the semiconductor substrate 10 in the main non-operating region 1b and all of the electrode pads of the main non-operating region 1b. The planar gate structure of the gate potential of the current sensing portion 12 enables the gate capacitance of the current sensing portion 12 to be increased. The extended portions 39b' of the gate electrodes 39b are covered by the interlayer insulating film 40. The extended portions 39b' of the gate electrodes 39b are electrically insulated from all of the electrode pads of the main non-operating region 1b, the barrier metals 46a, 46b, 46e, and the NiSi films 41a, 41b, by the interlayer insulating film 40.

In the sensing non-operating region 12b, the barrier metal 46b and the OC pad 22 extend from the sensing effective region 12a, on the interlayer insulating film 40 that covers the extended portions 39b' of the gate electrodes 39b. In the sensing non-operating region 12b, the terminal pins 48b are bonded on the OC pad 22 by a wiring structure similar to the wiring structure on the source pad 21a. The terminal pins 48b are wiring members having a round, rod-like shape (cylinder shape) of a diameter smaller than that of the terminal pins 48a.

Figure 5:
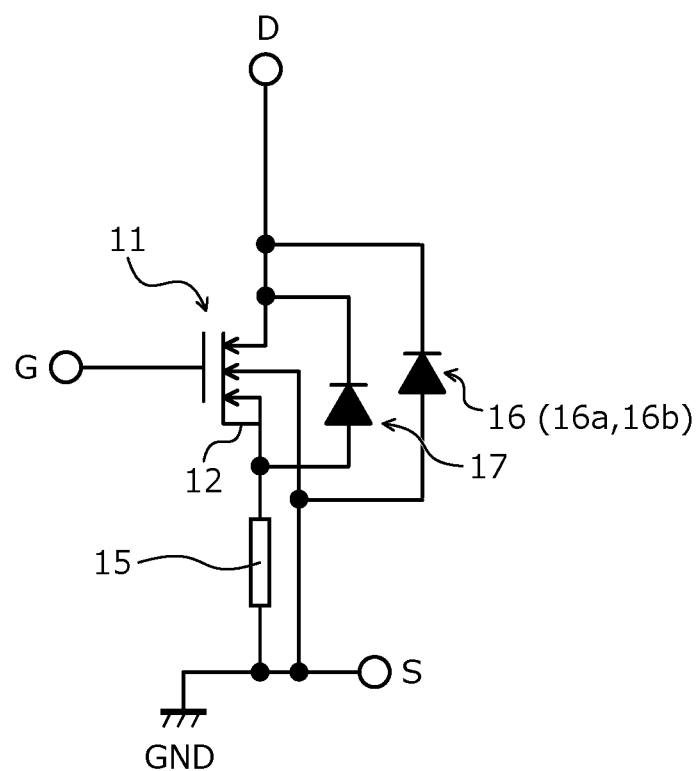
FIG. 5 is a circuit diagram of an equivalent circuit of the semiconductor device according to the first embodiment.

The terminal pins 48b, for example, are external connection terminals that lead out electric potential of the OC pad 22 and connect the OC pad 22 to a ground potential via an external resistor 15 (refer to FIG. 5). Disposal of the terminal pins 48b in the sensing non-operating region 12b enables pressure generated during bonding of the terminal pins 48b to be prevented from being applied to the unit cells of the current sensing portion 12. Reference characters 47b, 49b, and 50b are respectively a plating film and first and second protective films that configure the wiring structure on the OC pad 22.

The temperature sensing portion 13, for example, is a polysilicon diode formed by a pn junction between a p-type polysilicon layer 81 that forms a p-type anode region and an n-type polysilicon layer 82 that forms an n-type cathode region (FIG. 3). The p-type polysilicon layer 81 and the n-type polysilicon layer 82 are provided on the interlayer insulating film 40 that covers the extended portions 39b' of the gate electrodes 39b, in the main non-operating region 1b. The temperature sensing portion 13 is electrically insulated from the main semiconductor element 11 and the current sensing portion 12 by the interlayer insulating film 40.

The interlayer insulating film 40, the p-type polysilicon layer 81, and the n-type polysilicon layer 82 are covered by an interlayer insulating film 83. The anode pad 23a and the cathode pad 23b are respectively in contact with the p-type polysilicon layer 81 and the n-type polysilicon layer 82 at third and fourth contact holes 83a, 83b of the interlayer insulating film 83. Materials of the anode pad 23a and the cathode pad 23b, for example, are similar to that of the source pad 21a.

The terminal pins 48c, 48d are respectively bonded on the anode pad 23a and on the cathode pad 23b, by wiring structures similar to the wiring structure on the source pad 21a. The terminal pins 48c, 48d are external connection terminals that respectively lead out electric potential of the anode pad 23a and electric potential of the cathode pad 23b to an external destination. The terminal pins 48c, 48d are wiring members having a round, rod-like shape of a predetermined diameter.

Reference characters 47c and 47d are respectively plating films configuring the wiring structure on the anode pad 23a and the wiring structure on the cathode pad 23b. Reference characters 49c and 50c are respectively first and second protective films forming a wiring structure on the temperature sensing portion 13. The p-type region 52', the n-type region 53', and the p-type region 54' described above of the main non-operating region 1b extend on a surface region of the front surface of the semiconductor substrate 10, directly beneath the temperature sensing portion 13.

In the gate pad portion 14, the gate pad 21b of the main semiconductor element 11 is provided on the interlayer insulating film 40 that covers the extended portions 39b' of the gate electrodes 39b (FIG. 4). The barrier metal 46e having a stacked structure similar to that of the barrier metal 46a may be provided between the gate pad 21b and the interlayer insulating film 40. A material of the gate pad 21b, for example, may be similar to that of the source pad 21a. On the gate pad 21b as well, for example, the terminal pins 48e are bonded by a wiring structure similar to the wiring structure on the source pad 21a.

The terminal pins 48e are external connection terminals that lead out electric potential of the gate pad 21b to an external destination. The terminal pins 48e are wiring members having a round, rod-like shape of a predetermined diameter. Reference characters 47e, 49e, and 50e are respectively a plating film and first and second protective films that configure a wiring structure on the gate pad 21b. The p-type region 52', the n-type region 53', and the p-type region 54' described above of the main non-operating region 1b extend on a surface region of the front surface of the semiconductor substrate 10, directly beneath the gate pad 21b.

Operation of the semiconductor device 20 according to the first embodiment will be described taking, as an example, a case in which the p-type region 52' of the main non-operating region 1b is fixed at the source electric potential of the main semiconductor element 11. FIG. 5 is a circuit diagram of an equivalent circuit of the semiconductor device according to the first embodiment. As depicted in FIG. 5, the current sensing portion 12 is connected in parallel to plural MOSFET unit cells configuring the main semiconductor element 11. A ratio (hereinafter, current sensing ratio) of a sensing current flowing in the current sensing portion 12 and the main current flowing in the main semiconductor element 11 is preset.

The current sensing ratio, for example, may be set by changing the quantity of unit cells in the main semiconductor element 11 and in the current sensing portion 12. A sensing current that is smaller than the main current that flows in the main semiconductor element 11 flows in the current sensing portion 12, corresponding to the current sensing ratio. A source of the main semiconductor element 11 is connected to a grounding point GND of the ground potential. The resistor 15, which is an external component, is connected between the grounding point GND and a source of the current sensing portion 12.

In a state where voltage that is positive with respect to the source electrode of the main semiconductor element 11 (the source pad 21*a*) is applied to the drain electrode 51 and voltage that is at least equal to a threshold voltage is applied to the gate electrodes 39*a* of the main semiconductor element 11, an n-type inverse layer (channel) is formed in portions of the p-type base region 34*a* of the main semiconductor element 11 sandwiched between one of the n$^+$-type source regions 35*a* and one of the n-type current spreading regions 33*a*. As a result, the main current flows from the drain of the main semiconductor element 11 toward the source thereof and the main semiconductor element 11 turns ON.

Here, in a state in which voltage that is positive with respect to the source electrode (the OC pad 22) of the current sensing portion 12 is applied to the drain electrode 51 under conditions similar to those of the main semiconductor element 11, when voltage at least equal to the threshold voltage is applied to the gate electrodes 39*b* of the current sensing portion 12, an n-type inverse layer is formed in a portion of the p-type base region 34*b* of the sensing effective region 12*a*, the portion sandwiched between the n$^+$-type source regions 35*b* and the n-type current spreading region 33*b*. As a result, sensing current from the drain of the current sensing portion 12 toward the source thereof flows and the current sensing portion 12 turns ON.

The sensing current passes through the resistor 15 connected to the source of the current sensing portion 12 and flows to the grounding point GND. As a result, a voltage decrease occurs at the resistor 15. When overcurrent is applied to the main semiconductor element 11, the sensing current of the current sensing portion 12 increases according to the magnitude of the overcurrent to the main semiconductor element 11 and the voltage decrease at the resistor 15 also increases. The magnitude of the voltage decreases at the resistor 15 is monitored, thereby enabling detection of the overcurrent in the main semiconductor element 11.

On the other hand, when voltage less than the threshold voltage is applied to the gate electrodes 39*a* of the main semiconductor element 11, pn junctions between the first and the second p$^+$-type regions 61*a*, 62*a*, the n-type current spreading regions 33*a*, and the n$^-$-type drift region 32 of the main semiconductor element 11 are reverse biased. The voltage that is less than the threshold voltage is further applied to the gate electrodes 39*b* of the current sensing portion 12; and pn junctions between the first and the second p$^+$-type regions 61*b*, 62*b*, the n-type current spreading regions 33*b*, and the n$^-$-type drift region 32 of the current sensing portion 12 are also reverse biased. As a result, the main current of the main semiconductor element 11 and the sensing current of the current sensing portion 12 are blocked; and the main semiconductor element 11 and the current sensing portion 12 maintain the OFF state.

When the main semiconductor element 11 is OFF and voltage that is negative with respect to the source electrode of the main semiconductor element 11 is applied to the drain electrode 51, the parasitic diode 16*a* formed in the main effective region 1*a* of the active region 1 by pn junctions between the p-type base region 34*a*, the first and the second p$^+$-type regions 61*a*, 62*a*, the n-type current spreading regions 33*a*, and the n$^-$-type drift region 32 is energized. Further, the parasitic diode 16*b* formed in the main non-operating region 1*b* of the active region 1 by pn junctions between the p-type base region 34*b*', the second p$^+$-type region 62*b*', and the n$^-$-type drift region 32 (in a case where the second p$^+$-type region 62*b*' is not provided, a pn junction between the p-type base region 34*b*' and the n$^-$-type drift region 32) is energized.

The parasitic diodes 16*a*, 16*b* are the parasitic diode 16 of the main semiconductor element 11. When the parasitic diode 16 of the main semiconductor element 11 is energized, a parasitic diode formed by a pn junction between the p-type region for element separation and the n$^-$-type drift region 32 in the edge termination region 2 is also energized. Even when the current sensing portion 12 is OFF, when a voltage that is negative with respect to the source electrode of the current sensing portion 12 is applied to the drain electrode 51, a parasitic diode 17 formed by pn junctions between the p-type base region 34*b* of the sensing effective region 12*a*, the first and the second p*-type regions 61*b*, 62*b*, the n-type current spreading regions 33*b*, and the n$^-$-type drift region 32 in the main non-operating region 1*b* of the active region 1 is energized.

A method of manufacturing the semiconductor device 20 according to the first embodiment will be described. FIGS. 6, 7, 8, 9, 10, and 11 are cross-sectional views of the semiconductor device according to the first embodiment during manufacture. In FIGS. 6 to 11, while only the main semiconductor element 11 is depicted, the parts of all elements fabricated (manufactured) on the semiconductor substrate 10 that has the main semiconductor element 11, for example, are formed concurrently with the parts of the main semiconductor element 11. Formation of the parts of the current sensing portion 12, the temperature sensing portion 13, and the gate pad portion 14 will be described with reference to FIGS. 1 to 4.

Figure 6:
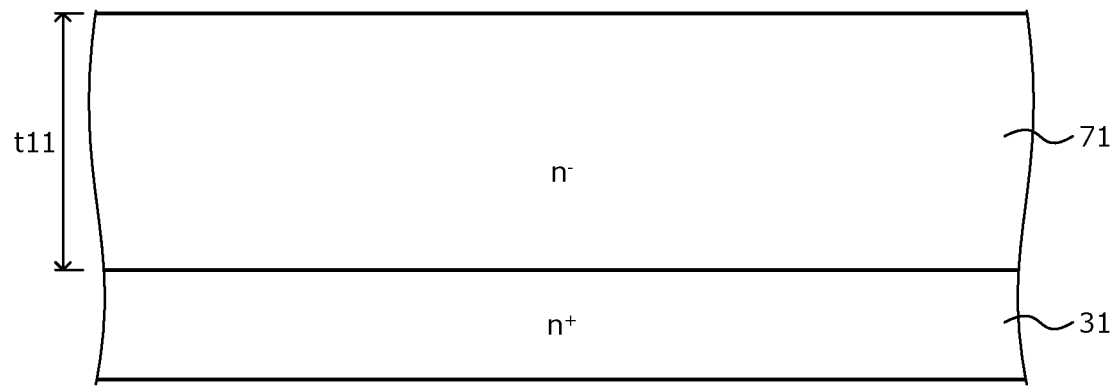
FIG. 6 is a cross-sectional view of the semiconductor device according to the first embodiment during manufacture.

First, as depicted in FIG. 6, the n$^+$-type starting substrate (semiconductor wafer) 31 containing silicon carbide is prepared. The n$^+$-type starting substrate 31, for example, may be a silicon carbide single crystal substrate doped with nitrogen (N). Next, on a front surface of the n$^+$-type starting substrate 31, the n-type silicon carbide layer 71 doped with nitrogen at a lower concentration than is the n$^+$-type starting substrate 31 is formed by epitaxial growth. When the main semiconductor element 11 has a breakdown voltage of 3300V, a thickness t11 of the n$^-$-type silicon carbide layer 71, for example, may be about 30 µm.

Figure 7:
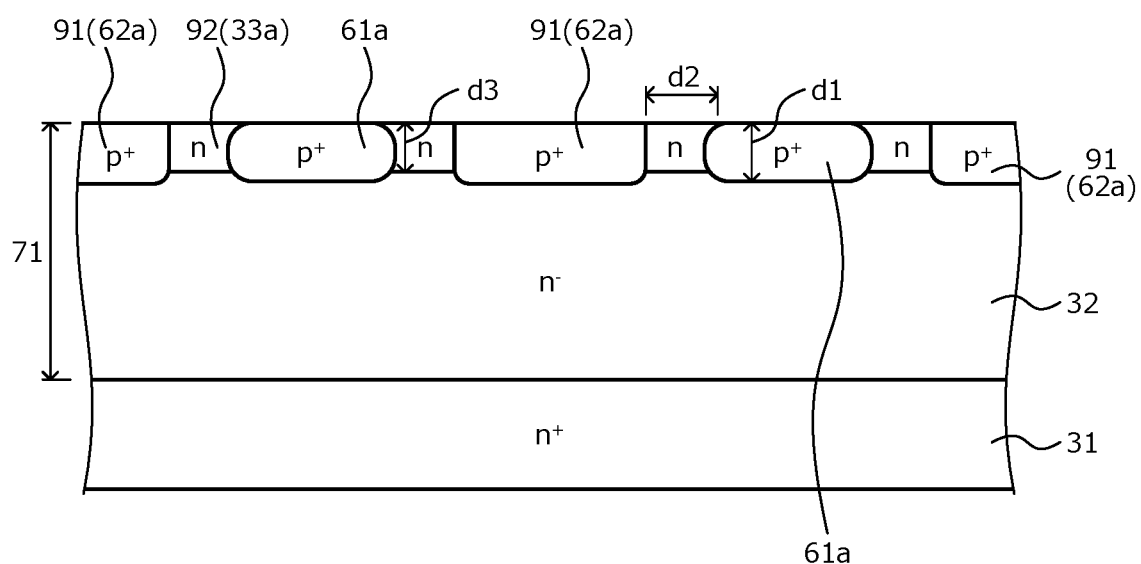
FIG. 7 is a cross-sectional view of the semiconductor device according to the first embodiment during manufacture.

Next, as depicted in FIG. 7, by photolithography and, for example, ion implantation of a p-type impurity such as Al, the first p$^+$-type regions 61*a* and p$^+$-type regions 91 are selectively formed at surface regions of the n$^-$-type silicon carbide layer 71 in the main effective region 1*a*. The p$^+$-type regions 91 are a part of the first p$^+$-type regions 62*a*. The first p$^+$-type regions 61*a* and the p$^+$-type regions 91, for example, are disposed to repeatedly alternate one another along the first direction X depicted in FIG. 1.

A distance d2 between one of the first p$^+$-type regions 61*a* and one of the p$^+$-type regions 91 adjacent to one another, for example, may be about 1.5 µm. A depth d1 and an impurity concentration of the first p$^+$-type regions 61*a* and the p$^+$-type regions 91, for example, may be about 0.5 µm and about 5.0×10$^{18}$/cm$^3$, respectively. Subsequently, an ion implantation mask (not depicted) used in forming the first p$^+$-type regions 61*a* and the p$^+$-type regions 91 is removed.

Next, by photolithography and, for example, ion implantation of an n-type impurity such as nitrogen, n-type regions 92 are formed at surface regions of the n$^-$-type silicon carbide layer 71, spanning the main effective region 1*a* overall. The n-type regions 92, for example, are each formed between one of the first p$^+$-type regions 61*a* and one of the p$^+$-type regions 91, to be in contact with these regions. A depth d3 and an impurity concentration of the n-type regions 92, for example, may be about 0.4 µm and about 1.0×10$^{17}$/cm$^3$, respectively.

The n-type regions 92 are parts of the n-type current spreading regions 33a. Portions of the n⁻-type silicon carbide layer 71 sandwiched between the n-type regions 92, the first p⁺-type regions 61a, the p⁺-type regions 91, and the n⁺-type starting substrate 31 are the n⁻-type drift region 32. Next, an ion implantation mask (not depicted) used in forming the n-type regions 92 is removed. A sequence in which the n-type regions 92, the first p⁺-type regions 61a, and the p⁺-type regions 91 are formed may be interchanged.

Figure 8:
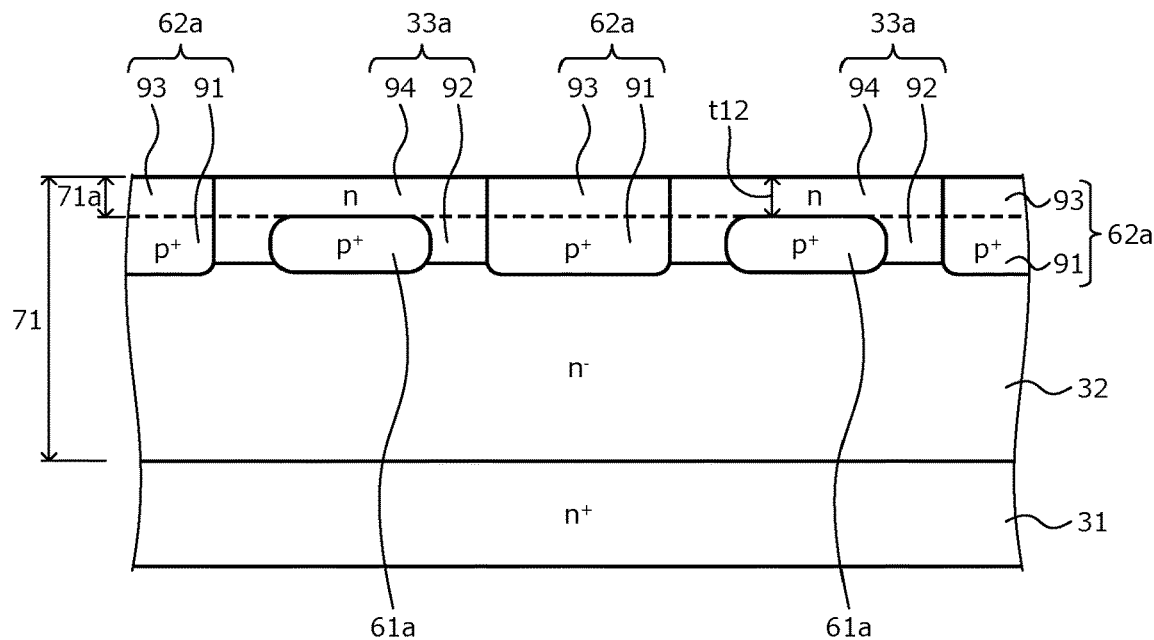
FIG. 8 is a cross-sectional view of the semiconductor device according to the first embodiment during manufacture.

Next, as depicted in FIG. 8, on the n⁻-type silicon carbide layer 71, for example, an n⁻-type silicon carbide layer doped with an n⁻-type impurity such as nitrogen is further formed, for example, to have a thickness t12 of 0.5 μm, thereby increasing the thickness of the n⁻-type silicon carbide layer 71.

Next, by photolithography and ion implantation of a p-type impurity such as Al, in a portion 71a increasing the thickness of the n⁻-type silicon carbide layer 71, p⁺-type regions 93 are selectively provided to a depth reaching the p⁺-type regions 91. The p⁺-type regions 91, 93 that are adjacent to one another in the depth direction Z are connected and form the first p⁺-type regions 62a. A width and an impurity concentration of the p⁺-type regions 93, for example, are substantially equal to those of the p⁺-type regions 91. Next, an ion implantation mask used in forming the p⁺-type regions 93 (not depicted) is removed.

Next, by photolithography and, for example, ion implantation of an n-type impurity such as nitrogen, in the portion 71a increasing the thickness of the n⁻-type silicon carbide layer 71, n-type regions 94 are selectively formed to a depth reaching the n-type regions 92. An impurity concentration of the n-type regions 94, for example, is substantially equal to that of the n-type regions 92. The n-type regions 92, 94 that are adjacent to one another in the depth direction Z are connected, whereby the n-type current spreading regions 33a are formed. A sequence in which the p⁺-type regions 93 and the n-type regions 94 are formed may be interchanged. Next, an ion implantation mask (not depicted) used in forming the n-type regions 94 is removed.

Figure 9:
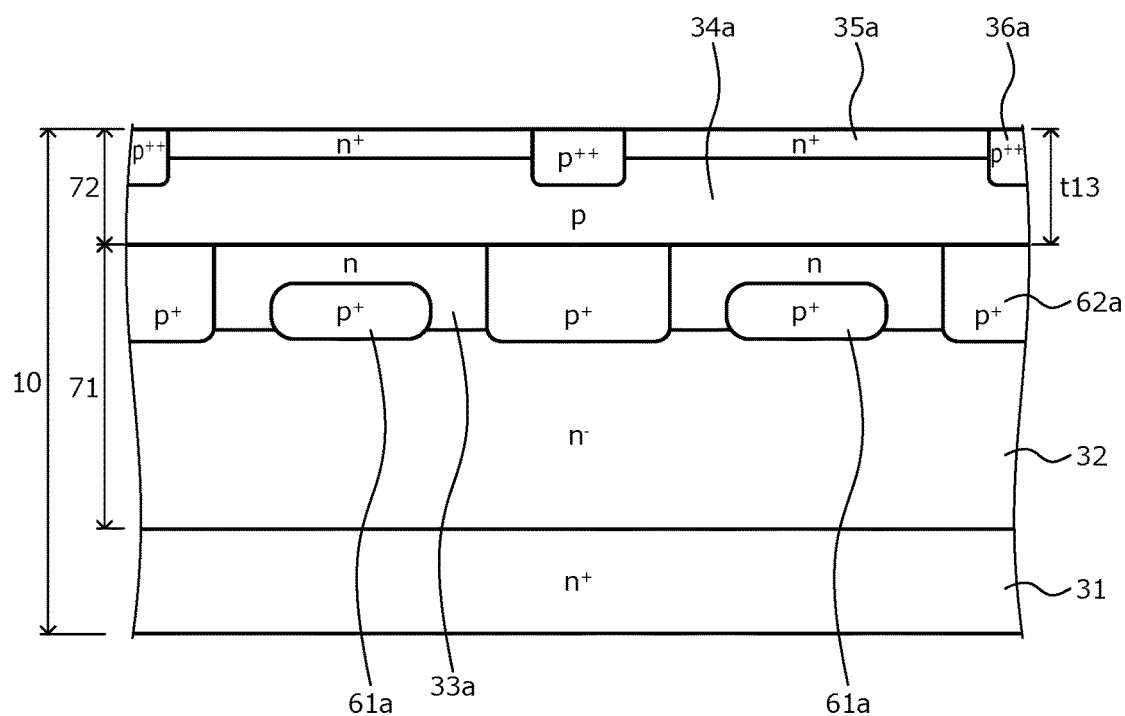
FIG. 9 is a cross-sectional view of the semiconductor device according to the first embodiment during manufacture.

Next, as depicted in FIG. 9, on the n⁻-type silicon carbide layer 71, for example, the p-type silicon carbide layer 72 doped with a p-type impurity such as Al is formed by epitaxial growth. A thickness t13 and an impurity concentration of the p-type silicon carbide layer 72, for example, may be about 1.3 μm and about 4.0×10¹⁷/cm³, respectively. As a result, the semiconductor substrate (semiconductor wafer) 10 in which the n⁻-type silicon carbide layer 71 and the p-type silicon carbide layer 72 are sequentially stacked on the n⁺-type starting substrate 31 by epitaxial growth is formed.

Next, a process including photolithography, ion implantation, and removal of the ion implantation mask as one set is repeatedly performed under different conditions, thereby selectively forming the n⁺-type source regions 35a and the p⁺⁺-type contact regions 36a (refer to FIG. 2) in the p-type silicon carbide layer 72, in the main effective region 1a.

A sequence in which the n⁺-type source regions 35a and the p⁺⁺-type contact regions 36a are formed may be interchanged. In the main effective region 1a, portions sandwiched by one of the n⁺-type source regions 35a, one of the p⁺⁺-type contact regions 36a, and the n⁻-type silicon carbide layer 71 is the p-type base region 34a. In the ion implantations described above, for example, a resist film or an oxide film may be used as an ion implantation mask.

Next, with respect to diffusion regions (the first and the second p⁺-type regions 61a, 62a, the n-type current spreading regions 33a, the n⁺-type source regions 35a, and the p⁺⁺-type contact regions 36a) formed by ion implantation, for example, a heat treatment (activation annealing) for impurity activation is performed at a temperature of about 1700 degrees C. for about 2 minutes. The activation annealing may be performed once for all of the diffusion regions collectively after formation or may be performed at each ion implantation for forming the diffusion regions.

Figure 10:
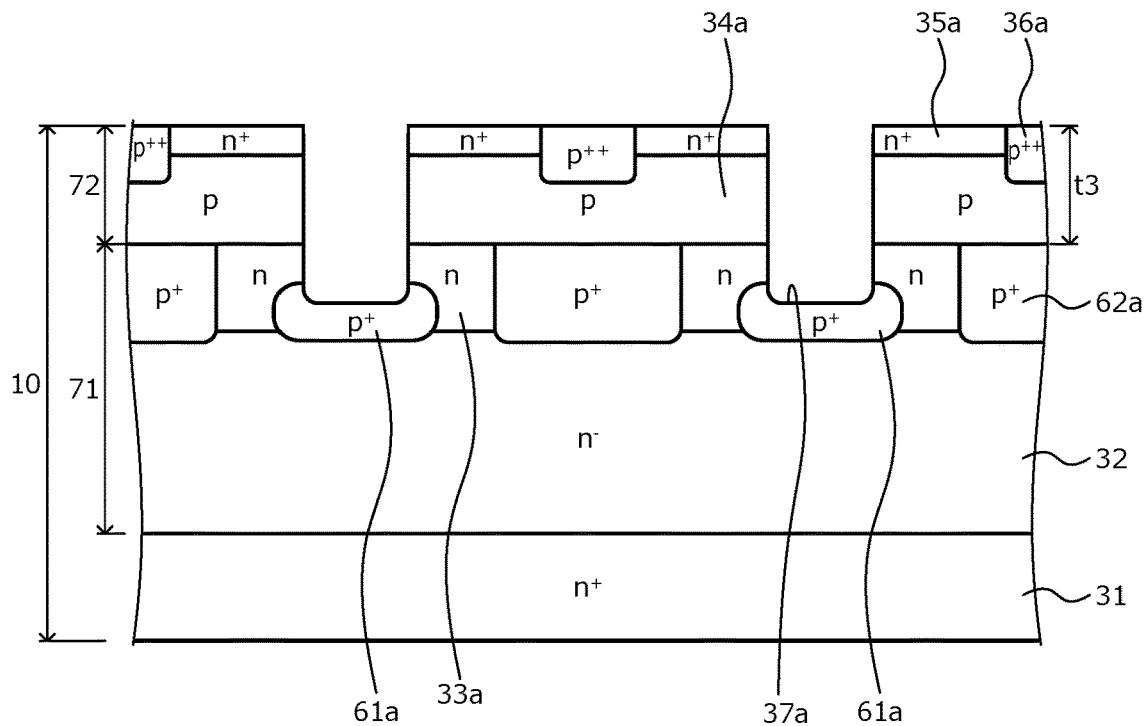
FIG. 10 is a cross-sectional view of the semiconductor device according to the first embodiment during manufacture.

Next, as depicted in FIG. 10, by photolithography and, for example, dry etching, the trenches 37a that penetrate through the n⁺-type source regions 35a and the p-type base region 34a are formed. The trenches 37a, for example, have a depth reaching the first p⁺-type regions 61a in the n-type current spreading regions 33a. As an etching mask for forming the trenches 37a, for example, a resist mask or an oxide mask may be used. Subsequently, the etching mask is removed.

Figure 11:
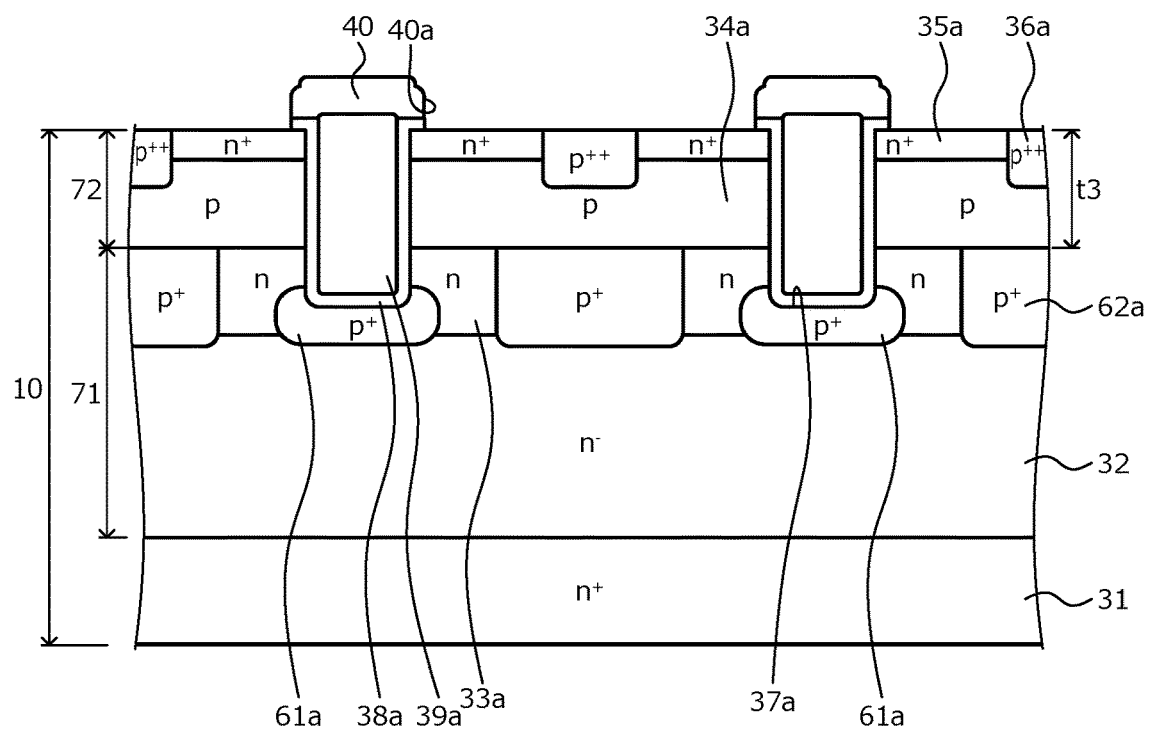
FIG. 11 is a cross-sectional view of the semiconductor device according to the first embodiment during manufacture.

Next, as depicted in FIG. 11, the gate insulating film 38a is formed along the surface of the semiconductor substrate 10 and inner walls of the trenches 37a. The gate insulating film 38a, for example, may be a thermal oxide film formed by a temperature of about 1000 degrees C. in an oxygen ($O_2$) atmosphere, or a deposited film of a high temperature oxide (HTO). Next, in the trenches 37a, on the gate insulating film 38a, for example, a polysilicon layer doped with phosphorus is formed as the gate electrodes 39a.

All elements other than those of the main semiconductor element 11 (for example, the current sensing portion 12, for example, a diffusion diode forming the over-voltage protecting portion, a complementary MOS (CMOS) configuring the arithmetic circuit portion), the n⁻-type region 32b, the p-type base region 34b', the second p⁺-type region 62b', the p⁺-type region 63b, the n-type regions 53, 53', and the p-type regions 54, 54' suffice to be formed in the main non-operating region 1b of the semiconductor substrate 10, in the formation of the parts of the main semiconductor element 11 described above, concurrently with corresponding parts of the main semiconductor element 11, or independently at a timing different from formation of the parts of the main semiconductor element 11.

For example, diffusion regions disposed in the main non-operating region 1b of the semiconductor substrate 10 suffice to be formed concurrently with diffusion regions of a same conductivity type, a same impurity concentration, and a same diffusion depth among the diffusion regions configuring the main semiconductor element 11. The n⁻-type region 32b separates the sensing effective region 12a and the p-type region 52 (the p-type base region 34b' and the second p⁺-type region 62b') of the main non-operating region 1b. Further, gate trenches, gate insulating films, and gate electrodes of elements disposed on the semiconductor substrate 10 suffice to be respectively formed concurrently with the trenches 37a, the gate insulating film 38a, and the gate electrodes 39a of the main semiconductor element 11.

In the main non-operating region 1b, the extended portions 38b', 39b' of the gate insulating films 38b and the gate electrodes 39b disposed on the front surface of the semiconductor substrate 10 suffice to be formed by selectively leaving, on the front surface of the semiconductor substrate 10 in the main non-operating region 1b, a gate oxide film and a polysilicon layer forming the extended portions 38b', 39b' of the gate insulating films 38b and the gate electrodes 39b, when the gate insulating films 38b and the gate electrodes 39b of the current sensing portion 12 are formed concurrently with the gate insulating film 38a and the gate electrodes 39a of the main semiconductor element 11.

Next, the interlayer insulating film 40 is formed at an entire area of the front surface of the semiconductor substrate 10 so that the interlayer insulating film 40 covers the gate electrodes 39a, 39b and the extended portions 39b' of the gate electrodes 39b. Next, on the interlayer insulating film 40 in the main non-operating region 1b, for example, a phosphorus-doped polysilicon layer that forms the n-type polysilicon layer 82 is deposited, and a portion of the polysilicon layer is set to a p-type region and forms the p-type polysilicon layer 81. Next, the polysilicon layer is patterned to leave only portions that form the p-type polysilicon layer 81 and the n-type polysilicon layer 82.

The gate runner (not depicted) may be formed concurrently with the formation of the p-type polysilicon layer 81 and the n-type polysilicon layer 82. By a portion of the p-type polysilicon layer deposited concurrently with the formation of the gate electrodes 39a of the main semiconductor element 11, the p-type polysilicon layer 81 may be formed concurrently with the gate electrodes 39a. A portion of the p-type polysilicon layer deposited concurrently with the formation of the gate electrodes 39a of the main semiconductor element 11 may be set to an n-type region and form the n-type polysilicon layer 82.

Next, the interlayer insulating film 83 is formed at the front surface of the semiconductor substrate 10 and the interlayer insulating film 83 covers the p-type polysilicon layer 81 and the n-type polysilicon layer 82. The interlayer insulating films 40, 83 may be, for example, a phosphosilicate glass (PSG). The interlayer insulating films 40, 83 may have a thickness that is, for example, about 1 µm. Next, by photolithography and etching, the interlayer insulating film 40 and the gate insulating films 38a, 38b are selectively removed, thereby forming the first and the second contact holes 40a, 40b.

Here, the first contact holes 40a are formed exposing the $n^+$-type source regions 35a and the $p^{++}$-type contact regions 36a of the main semiconductor element 11. In the sensing effective region 12a, the second contact holes 40b are formed exposing the $n^+$-type source regions 35b and the $p^{++}$-type contact regions 36b of the current sensing portion 12. Next, the interlayer insulating films 40, 83 are planarized by a heat treatment (reflow).

Next, for example, by sputtering, the first TiN films 42a, 42b, 42e are formed at an entire area of the front surface of the semiconductor substrate 10. The first TiN films 42a, 42b, 42e cover an entire area of the surfaces of the interlayer insulating films 40, 83 and cover portions (the $n^+$-type source regions 35a, 35b and the $p^{++}$-type contact regions 36a, 36b) of the front surface of the semiconductor substrate 10 exposed by the first and the second contact holes 40a, 40b.

Next, by photolithography and etching, in the first and the second contact holes 40a, 40b, portions of the first TiN films 42a, 42b, 42e covering the semiconductor substrate 10 are removed, whereby the $n^+$-type source regions 35a, 35b and the $p^{++}$-type contact regions 36a, 36b are again exposed. As a result, the first TiN film 42a, 42b, 42e are left at an entire area of the surfaces of the interlayer insulating films 40, 83 as the barrier metals 46a, 46b.

Next, for example, by sputtering, on semiconductor portions (the front surface of the semiconductor substrate 10) exposed in the first and the second contact holes 40a, 40b, an Ni film (not depicted) is formed. Here, the Ni film is further formed on the first TiN films 42a, 42b, 42e. Next, for example, by a heat treatment of about 970 degrees C., portions of the Ni film in contact with the semiconductor portions are converted into a silicide, thereby forming the NiSi films 41a, 41b that form ohmic contacts with the semiconductor portions.

During the heat treatment for converting nickel into a silicide, the first TiN films 42a, 42b, 42e are disposed between the Ni film and the interlayer insulating films 40, 83, whereby diffusion of nickel atoms in the Ni film to the interlayer insulating films 40, 83 may be prevented. Portions of the Ni film on the interlayer insulating films 40, 83 are not in contact with the semiconductor portions and therefore, are not converted into a silicide. Thereafter, the portions of the Ni film on the interlayer insulating films 40, 83 are removed, thereby exposing the interlayer insulating films 40, 83.

Next, at the back surface of the semiconductor substrate 10, for example, a Ni film is formed. Next, for example, by a heat treatment of about 970 degrees C., the Ni film is converted into a silicide, thereby forming, as the drain electrode 51, a NiSi film that forms an ohmic contact with the $n^+$-type drain region (the back surface of the semiconductor substrate 10 (the back surface of the $n^+$-type starting substrate 31)). The heat treatment for forming the ohmic contact between the drain electrode 51 and the $n^+$-type drain region may be performed concurrently with the heat treatment for forming the NiSi films 41a, 41b of the front surface of the semiconductor substrate 10.

Next, by sputtering, the first titanium films 43a, 43b, 43e, the second titanium films 44a, 44b, 44e, and the second Ti films 45a, 45b, 45e that form the barrier metals 46a, 46b, 46e, and an Al film (or an Al alloy film) that forms the source pad 21a, the gate pad 21b, and the OC pad 22 are sequentially stacked on the front surface of the semiconductor substrate 10. The Al film has a thickness that is at most, for example, about 5 µm.

Next, by photolithography and etching, the metal films deposited on the front surface of the semiconductor substrate 10 are patterned, thereby leaving portions that form the barrier metals 46a, 46b, 46e, the source pad 21a, the gate pad 21b, the OC pad 22, the OV pad (not depicted) of the over-voltage protecting portion, and the electrode pad (not depicted) of the arithmetic circuit portion. Formation of the metal films on the front surface of the semiconductor substrate 10 is performed in a state where the temperature sensing portion 13, for example, is covered by a resist mask.

Next, after the resist mask covering the temperature sensing portion 13 is removed, the interlayer insulating film 83 is selectively removed by photolithography and etching, thereby forming the third and the fourth contact holes 83a, 83b and exposing the p-type polysilicon layer 81 and the n-type polysilicon layer 82 in the third and the fourth contact holes 83a, 83b, respectively. Next, the interlayer insulating film 83 is planarized by a heat treatment.

Next, an Al film (or an Al alloy film) is formed on the front surface of the semiconductor substrate 10 so as to be embedded in the third and the fourth contact holes 83a, 83b and is patterned, whereby the anode pad 23a and the cathode pad 23b of the temperature sensing portion 13 are formed. Next, for example, by sputtering, at a surface of the drain electrode 51, for example, a Ti film, an Ni film, and a gold (Au) film are sequentially stacked, thereby forming the drain pad (not depicted).

Next, for example, by a chemical vapor deposition (CVD) method, the front surface of the semiconductor substrate 10 is protected by a polyimide film. Next, a heat treatment (curing) for hardening the polyimide film is performed. Next, the polyimide film is selectively removed by photolithography and etching, whereby the first protective films 49a to 49c, 49e respectively covering the electrode pads are formed and openings are formed in the first protective films 49a to 49c, 4e.

Next, after a general plating pretreatment, the plating films 47a to 47e are formed by a general plating process in portions of the electrode pads 21a, 21b, 22, 23a, 23b exposed in the openings of the first protective films 49a to 49c, 49e. Here, the first protective films 49a to 49c, 49e function as masks that suppress wet spreading of the plating films 47a to 47e. The plating films 47a to 47e may have a thickness that is, for example, about 5 μm. Next, a heat treatment (baking) for drying the plating films 47a to 47e is performed.

Next, for example, polyimide films that form the second protective films 50a to 50c, 50e that cover borders between the plating films 47a to 47e and the first protective films 49a to 49c, 49e are formed by a CVD method. Next, the polyimide films are cured. Next, the terminal pins 48a to 48e are respectively bonded on the plating films 47a to 47e by solder layers (not depicted). Here, the second protective films 50a to 50c, 50e function as masks that suppress wet spreading of the solder layers. Thereafter, the semiconductor substrate 10 is diced (cut) into individual chips, whereby the semiconductor device 20 depicted in FIGS. 1 to 3 is completed.

As described above, according to the first embodiment, on the front surface of the semiconductor substrate in the main non-operating region, a planar gate structure that extends from the sensing effective region and spans the gate insulating films and gate electrodes of the current sensing portion is provided. Therefore, the gate capacitance of the current sensing portion may be increased by an amount equivalent to the gate capacitance formed by the planar gate structure on the front surface of the semiconductor substrate, in the main non-operating region, thereby enabling the ESD capability of the current sensing portion to be increased by an amount equivalent to the amount of increase of the gate capacitance of the current sensing portion.

Further, according to the first embodiment, the extended portions of the gate insulating films of the current sensing portion are on the front surface of the semiconductor substrate in the main non-operating region and directly beneath the extended portions, a pn junction between a p-type region and an n-type region that are sequentially in order stated from the front side of the semiconductor substrate is formed between a pn junction that sustains a predetermined breakdown voltage of the main non-operating region and the front surface of the semiconductor substrate. Due to the formed pn junction, electric field is not applied to the extended portions of gate insulating films of the current sensing portion and therefore, dielectric breakdown voltage of the extended portions of the gate insulating films may be sustained.

Further, according to the first embodiment, as described above, the planar gate structure of the gate potential of the current sensing portion is disposed on the front surface of the semiconductor substrate in the main non-operating region, whereby the gate capacitance of the current sensing portion is increased. Therefore, since the gate capacitance of the current sensing portion is increased, unit cells of the trench gate structure not functioning as a MOSFET need not be disposed and new problems such as degradation of characteristics of the semiconductor device and decreases in yield due to formation precision of the gate trenches do not occur.

A semiconductor device according to a second embodiment will be described. FIG. 12 is a plan view of a layout when the semiconductor device according to the second embodiment is viewed from the front side of the semiconductor substrate. A semiconductor device 201 according to the second embodiment differs from the semiconductor device 20 according to the first embodiment (refer to FIGS. 1 to 4) in that in the active region 1 of the semiconductor substrate 10, only the main semiconductor element 11 and the current sensing portion 12 are included.

In other words, in the second embodiment, only the gate pad 21b and the OC pad 22 are disposed in the main non-operating region 1b. Therefore, the surface area of the main non-operating region 1b is smaller as compared to a case in which a high-function region other than the current sensing portion 12 is also disposed as a circuit region for protecting/controlling the main semiconductor element 11 together with the current sensing portion 12 on the semiconductor substrate 10 having the main semiconductor element 11.

On the front surface of the semiconductor substrate 10, in the main non-operating region 1b, the planar gate structure of the gate potential of the current sensing portion 12 configured by the extended portions 38b', 39b' of the gate insulating films 38b and the gate electrodes 39b of the current sensing portion 12 is provided, similarly to the first embodiment. The surface area of the planar gate structure of the gate potential of the current sensing portion 12 is substantially equal to the surface area of the p-type region 52 (the p-type base region 34b') of the main non-operating region 1b.

In this manner, even when the surface area of the main non-operating region 1b is reduced by disposing fewer electrode pads in the main non-operating region 1b, the gate capacitance of the current sensing portion 12 may be increased by an amount equivalent to the amount of the gate capacitance formed by the planar gate structure on the front surface of the semiconductor substrate 10 in the main non-operating region 1b. The surface area of the main effective region 1a is increased by an amount equivalent to the amount that the surface area of the main non-operating region 1b is reduced, thereby enabling current capacity of the semiconductor device 201 according to the second embodiment to be enhanced.

Further, in the main non-operating region 1b, at surface regions of the front surface of the semiconductor substrate 10, similarly to the first embodiment, the p-type region 52', the n-type region 53, and the p-type region 54 are disposed a positions separate from the sensing effective region 12a and facing the extended portions 39b' of the gate electrodes 39b in the depth direction Z. In the second embodiment, for example, the main effective region 1a may have a substantially rectangular planar shape in which a portion is recessed inward. The main non-operating region 1b is disposed in the recessed portion of the main effective region 1a and may have a substantially rectangular planar shape surrounded on three sides by the main effective region 1a.

Figure 2:
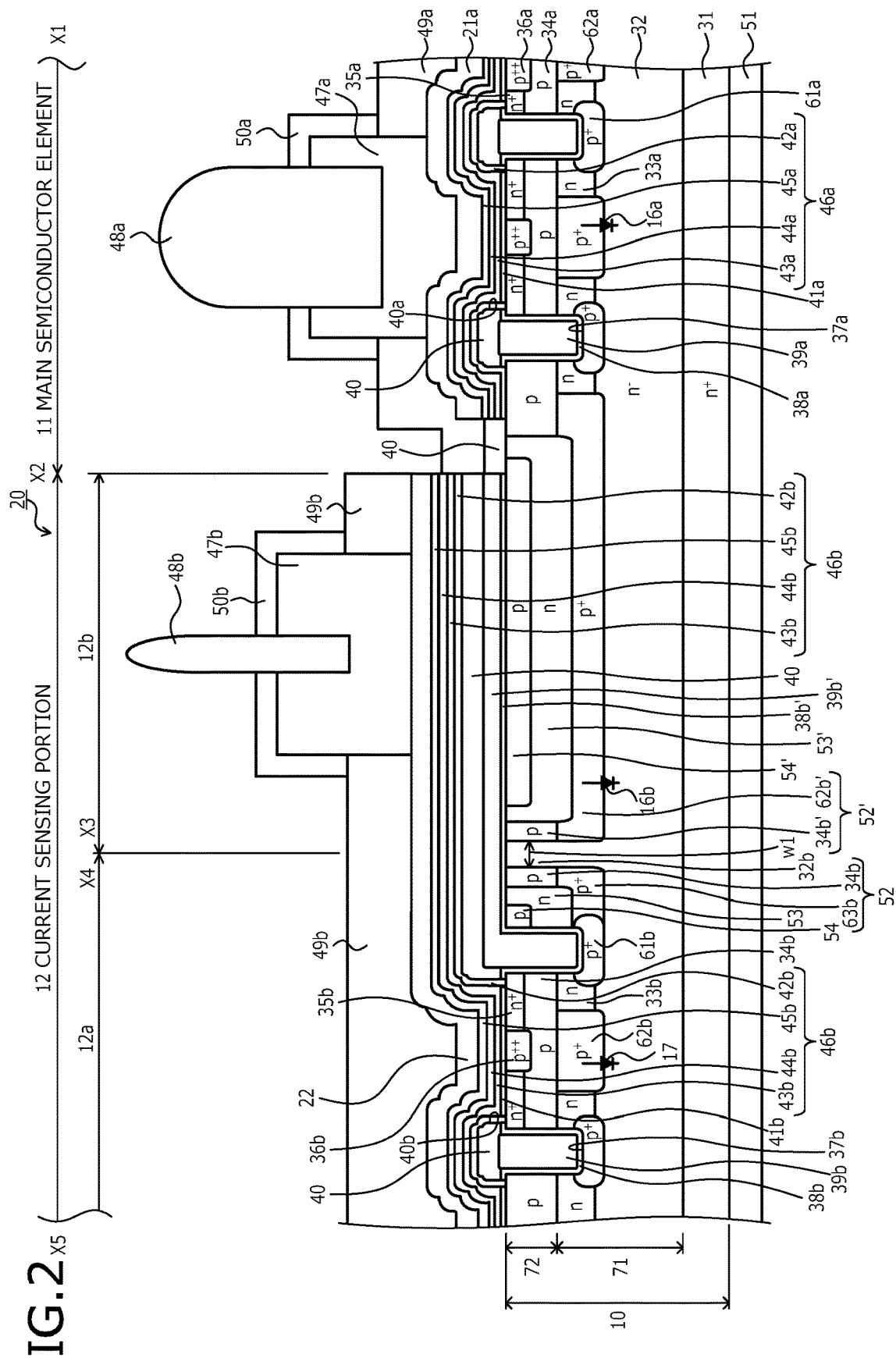
FIG. 2 is a cross-sectional view of the structure of an active region in FIG. 1.

In the second embodiment, a cross-section (cross-section of the structure along cutting line X1-X2-X3-X4-X5) of the structure of the main effective region 1a and the current sensing portion 12 is similar to that of the first embodiment (refer to FIG. 2). Cross-sections (cross-sections of the structure along cutting line X1-X2-X3 and cutting line Y1-Y2) of the structure of the main effective region 1a, the sensing non-operating region 12b, and the temperature sensing portion 13 are similar to those of the first embodiment (refer to FIG. 3). Cross-sections (cross-sections of the structure along cutting line X1-X2-X3 and cutting line Y2-Y3) of the structure of the main effective region 1a, the sensing non-operating region 12b, and the gate pad portion 14 are similar to those of the first embodiment (refer to FIG. 4).

As described above, according to the second embodiment, even when only the main semiconductor element and the current sensing portion are provided in the active region of the single semiconductor substrate, effects similar to those of the first embodiment may be obtained.

A semiconductor device according to a third embodiment will be described. FIG. 13 is a plan view of a layout when the semiconductor device according to the third embodiment is viewed from the front side of the semiconductor substrate. A semiconductor device 202 according to the third embodiment differs from the semiconductor device 201 according to the second embodiment (refer to FIG. 12) on the following two points. A first difference is that directly beneath the gate pad 21b and the OC pad 22, the p-type regions 52' are each provided to be separate from one another.

The p-type regions 52' each have a surface area that is greater than each of the surface areas of the electrode pads (the gate pad 21b and the OC pad 22) facing the p-type regions 52' in the depth direction Z and the p-type regions 52' each face an entire surface of each of the electrode pads in the depth direction Z. Between the front surface of the semiconductor substrate 10 and each of the p-type regions 52', similarly to the first embodiment, the n-type region 53 and the p-type region 54 are provided. The p-type region 52' directly beneath the OC pad 22, similarly to the first embodiment, is disposed separate from the sensing effective region 12a and surrounds a periphery of the sensing effective region 12a in a substantially rectangular shape.

A second difference is that the planar gate structure of the gate potential of the current sensing portion 12 is provided on the front surface of the semiconductor substrate 10, directly beneath and separate from the gate pad 21b and the OC pad 22. The planar gate structure directly beneath the OC pad 22, similarly to the first embodiment, is configured by the extended portions 38b', 39b' of the gate insulating films 38b and the gate electrodes 39b of the current sensing portion 12, extending from the sensing effective region 12a. The planar gate structure directly beneath the gate pad 21b, for example, may be formed to be independent of the planar gate structure directly beneath the OC pad 22.

In a region between the p-type region 52' directly beneath the gate pad 21b and the p-type region 52' directly beneath the OC pad 22, the unit cells of the main semiconductor element 11 are disposed, and the region between the p-type regions 52' may be set as a main effective region 1a'. In this manner, when the region is set as the main effective region 1a' and a parasitic diode formed by a pn junction between the p-type region 52' and the n⁻-type drift region 32 directly beneath the gate pad 21b turns OFF, positive hole current generated in the n⁻-type drift region 32 directly beneath the gate pad 21b may be lead out from the p-type base region 34a of the main effective region 1a' to the source pad 21a.

The third embodiment may be applied to the semiconductor device 20 according to the first embodiment (FIGS. 1 to 4). In other words, electrode pads other than the gate pad 21b and the OC pad 22 are further disposed in the main non-operating region 1b and a component including the planar gate structure of the gate potential of the current sensing portion 12, the p-type region 52', the n-type region 53, and the p-type region 54 as one set may be provided directly beneath each of the electrode pads, separate from one another, similarly to the first embodiment.

As described above, according to the third embodiment, even when directly beneath all of the electrode pads other than the source pad, p-type low-dose regions are respectively provided to be separate from each other, effects of the first and the second embodiments may be obtained.

A semiconductor device according to a fourth embodiment will be described. FIG. 14 is a plan view of a layout when the semiconductor device according to the fourth embodiment is viewed from the front side of the semiconductor substrate. A semiconductor device 20' according to the fourth embodiment differs from the semiconductor device 20 according to the first embodiment (refer to FIGS. 1 to 4) in that a metal electrode (hereinafter, lead-out electrode) 18 that leads positive hole current generated in the n⁻-type drift region 32 near the main non-operating region 1b out to the grounding point GND of the ground potential is provided.

The lead-out electrode 18 is provided on the front surface of the semiconductor substrate 10 in the main non-operating region 1b and is electrically connected to the p-type base region 34b'. The lead-out electrode 18 is fixed at the electric potential (source electric potential: ground potential) of the source pad 21a. The lead-out electrode 18, for example, is provided in an outer periphery portion of the main non-operating region 1b, along a border between the main non-operating region 1b and the edge termination region 2. The lead-out electrode 18 is electrically connected to the p-type base region 34b', in contact holes of a non-depicted interlayer insulating film, via p⁺⁺-type contact regions 19.

The p⁺⁺-type contact regions 19 are provided at surface regions of the semiconductor substrate 10, in the p-type base region 34b'. In FIG. 14, while a case is depicted in which the p⁺⁺-type contact regions 19 are respectively provided between the gate pad 21b and the edge termination region 2, and between the OC pad 22 and the edge termination region 2, any one of the p⁺⁺-type contact regions 19 suffices to be disposed. Further, the p⁺⁺-type contact regions 19 may be disposed between the anode pad 23a and the edge termination region 2, and/or between the cathode pad 23b and the edge termination region 2.

When the parasitic diodes 16, 17 (refer to FIG. 5) of the active region 1 turn OFF, positive hole current is generated in the n⁻-type drift region 32 of the main effective region 1a and/or the edge termination region 2 and flows into the main non-operating region 1b; the lead-out electrode 18 has a function of leading the positive hole current out to the grounding point GND of the ground potential, via the p-type base region 34b' and the p⁺⁺-type contact region 19. In FIG. 14, an inner periphery of the lead-out electrode 18 is indicated by a dashed line. An outer periphery of the lead-out electrode 18 is a same as the outer periphery of the main non-operating region 1b.

While not depicted, the fourth embodiment may be applied to the semiconductor devices 201, 202 (FIGS. 12, 13) according to the second and the third embodiments, and in the semiconductor device having only the main semiconductor element 11 and the current sensing portion 12 in the active region 1 of the semiconductor substrate 10, the lead-out electrode 18 that is electrically connected to each of the p-type base regions 34b' may be provided.

As described above, according to the fourth embodiment, effects similar to those of the first to the third embodiments may be obtained. Further, according to the fourth embodiment, in the main non-operating region, the lead-out electrode electrically connected to the p-type base region fixed at the source electric potential is provided, whereby when the parasitic diodes of the active region turn OFF, the positive hole current that flows into the main non-operating region may be lead out by the lead-out electrode and therefore, reverse recovery resistance of the parasitic diode in the main non-operating region may be further enhanced.

Figure 15:
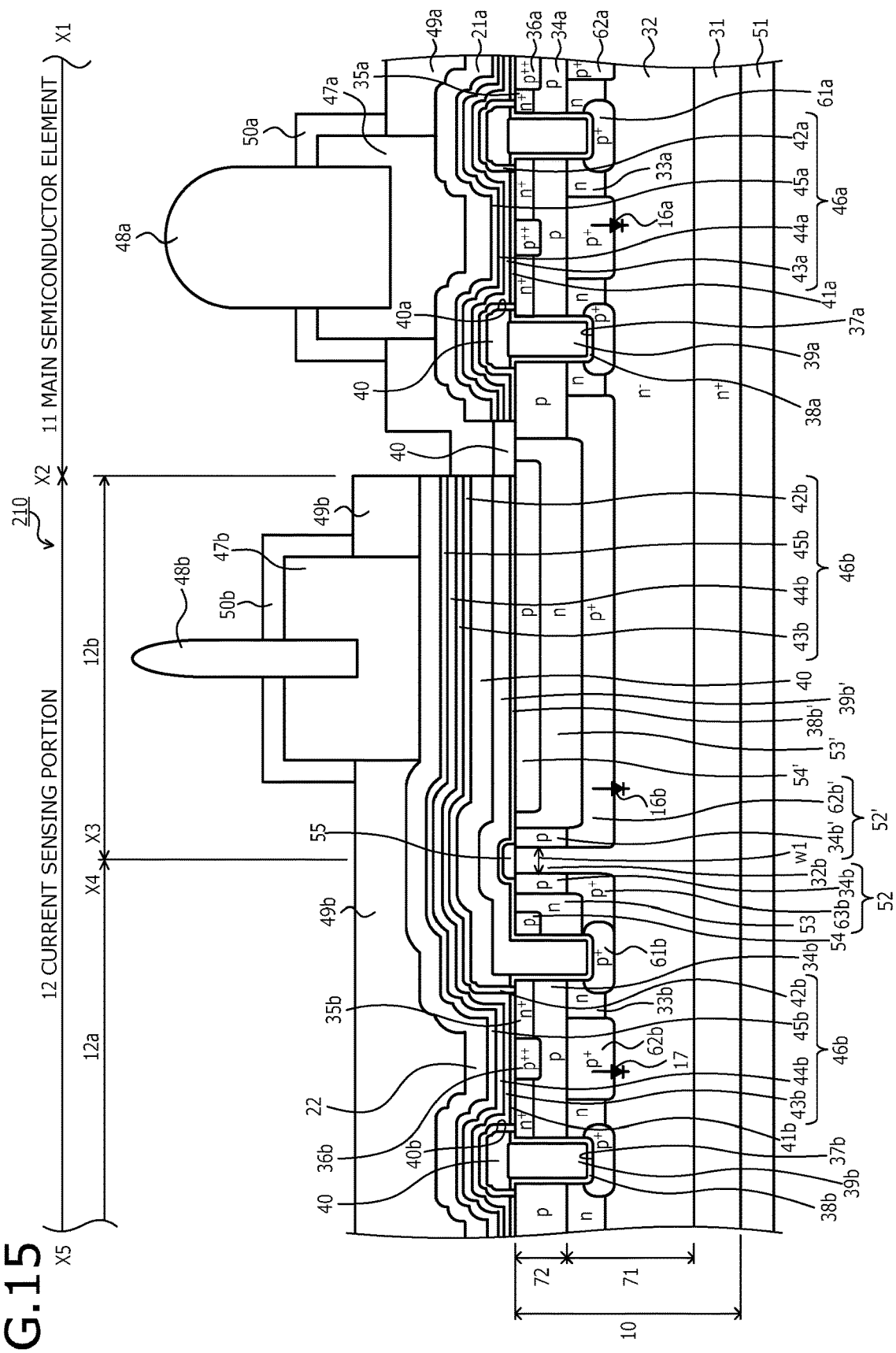
FIG. 15 is a cross-sectional view of a structure of the semiconductor device according to the fifth embodiment.
Figure 16:
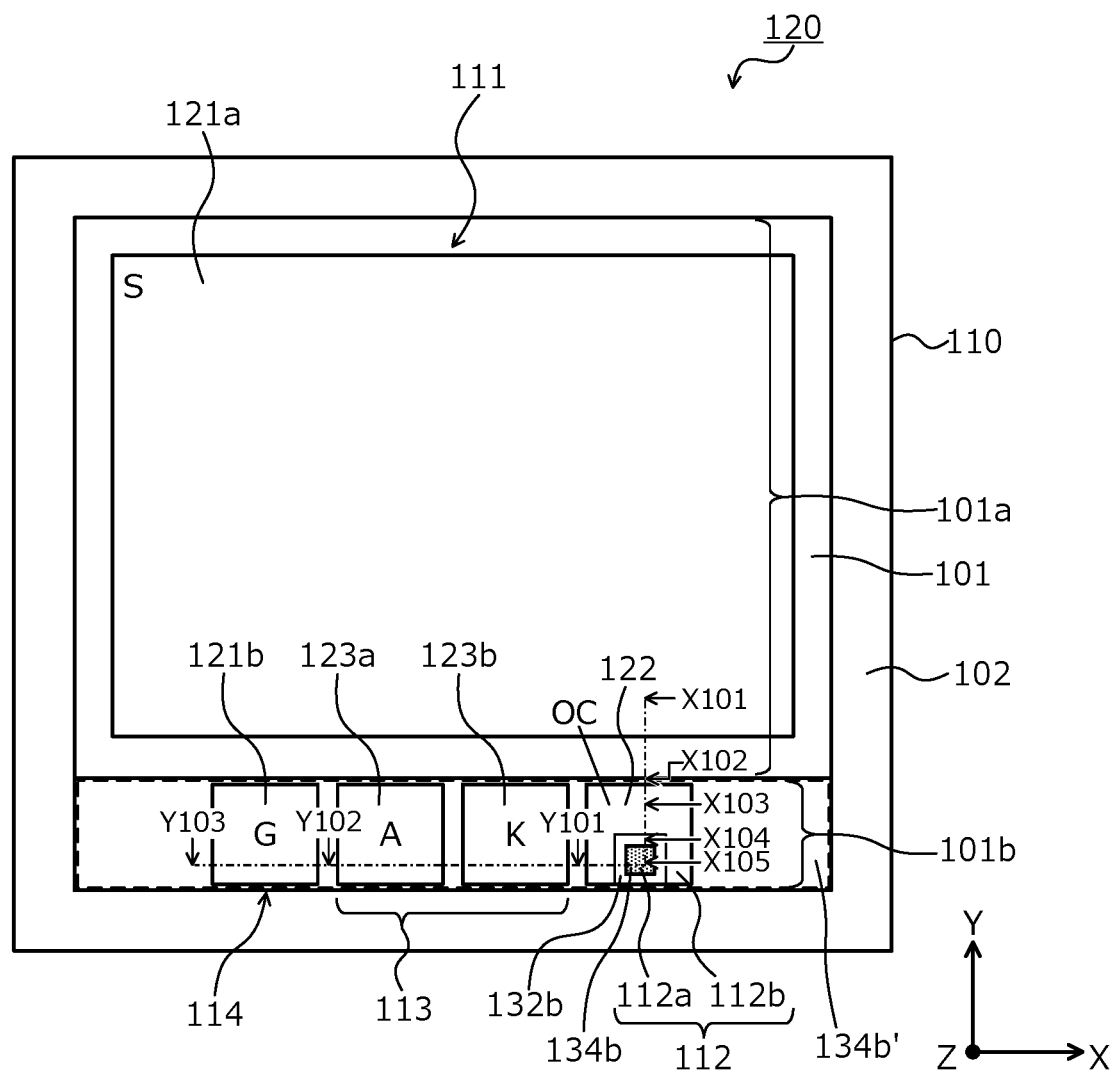
FIG. 16 is a plan view of a layout when a conventional semiconductor device is viewed from a front side of a semiconductor substrate.
Figure 17:
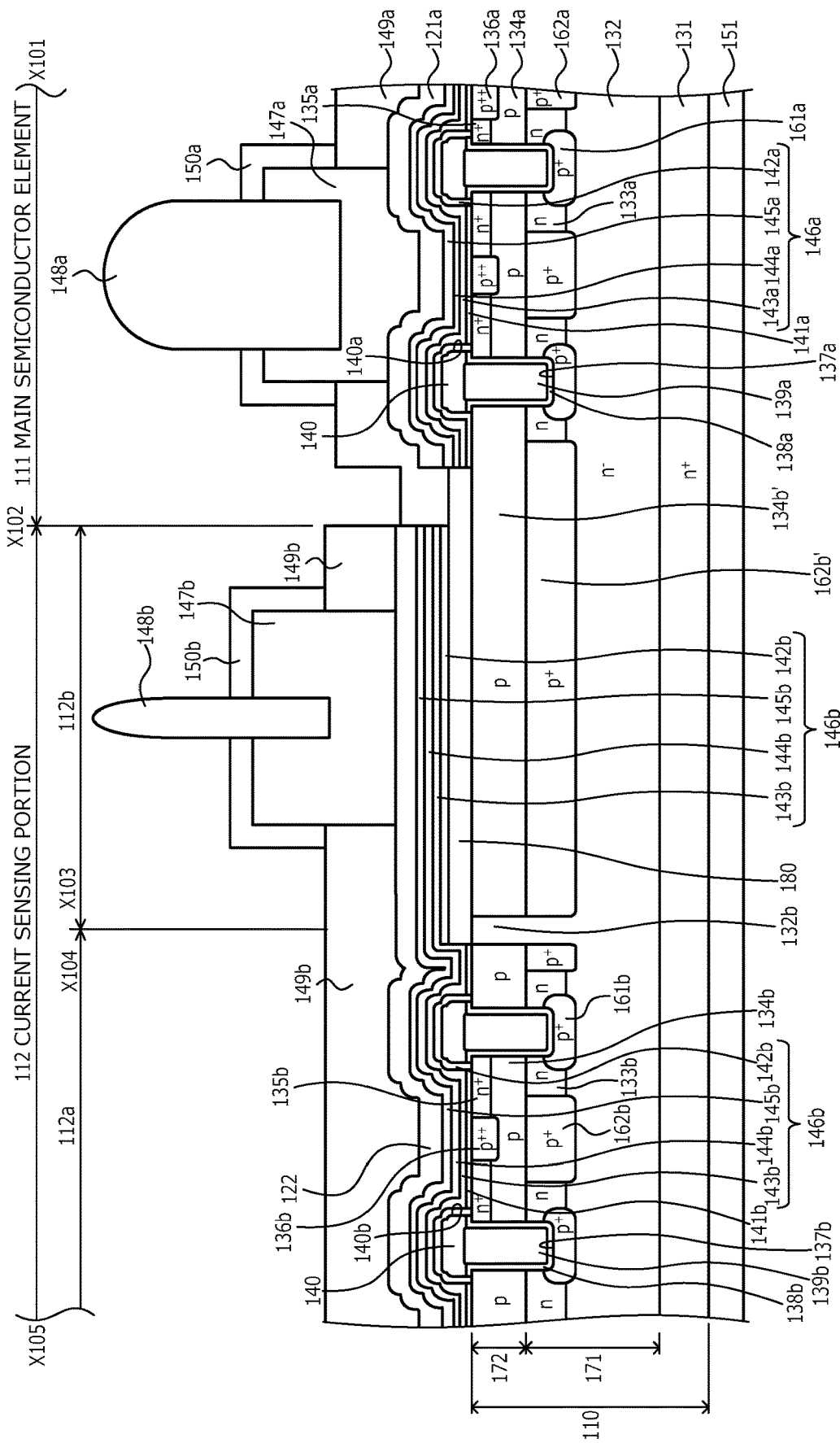
FIG. 17 is a cross-sectional view of a structure of an active region depicted in FIG. 16.
Figure 18:
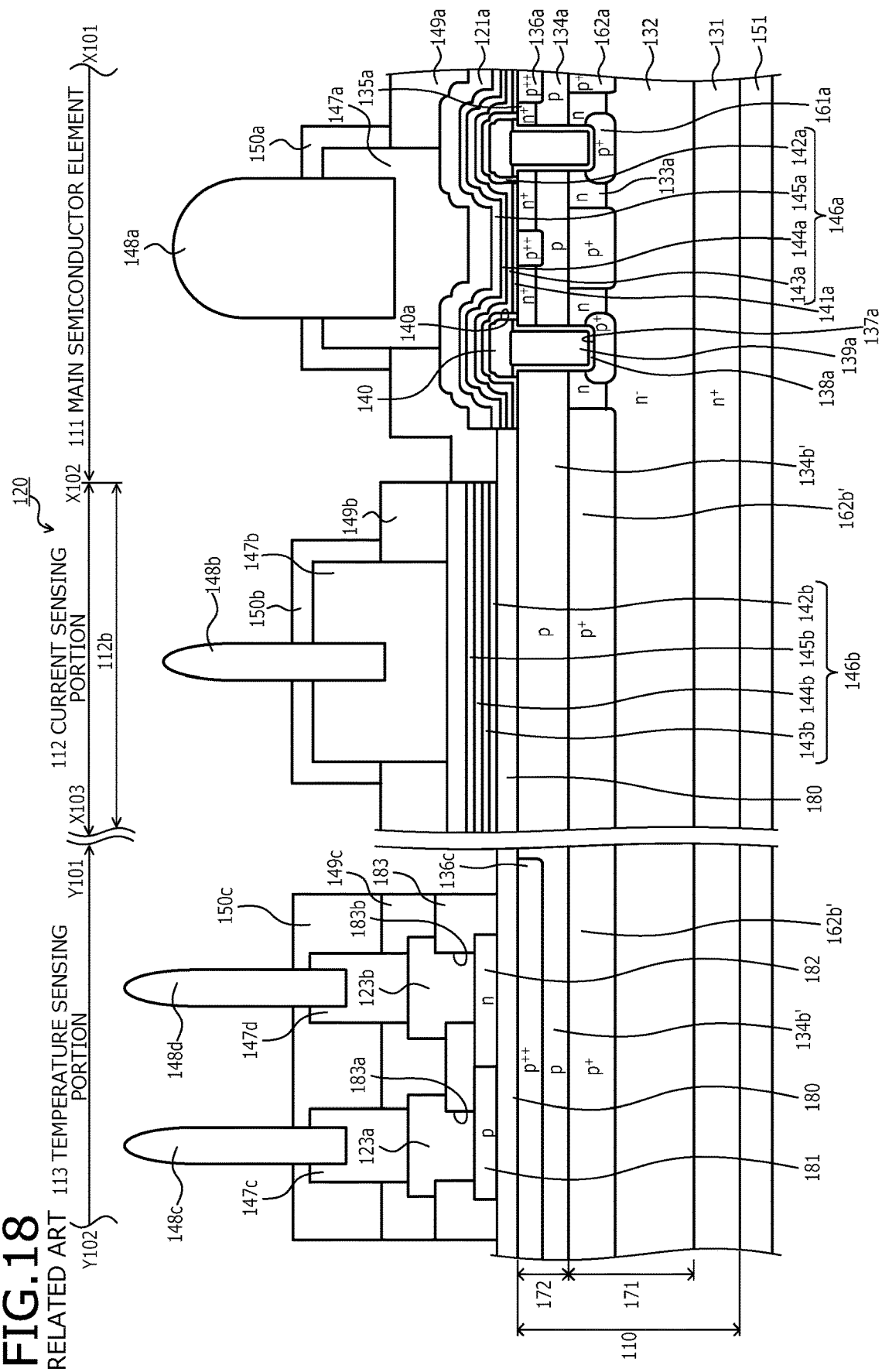
FIG. 18 is a cross-sectional view of a structure of the active region depicted in FIG. 16.
Figure 19:
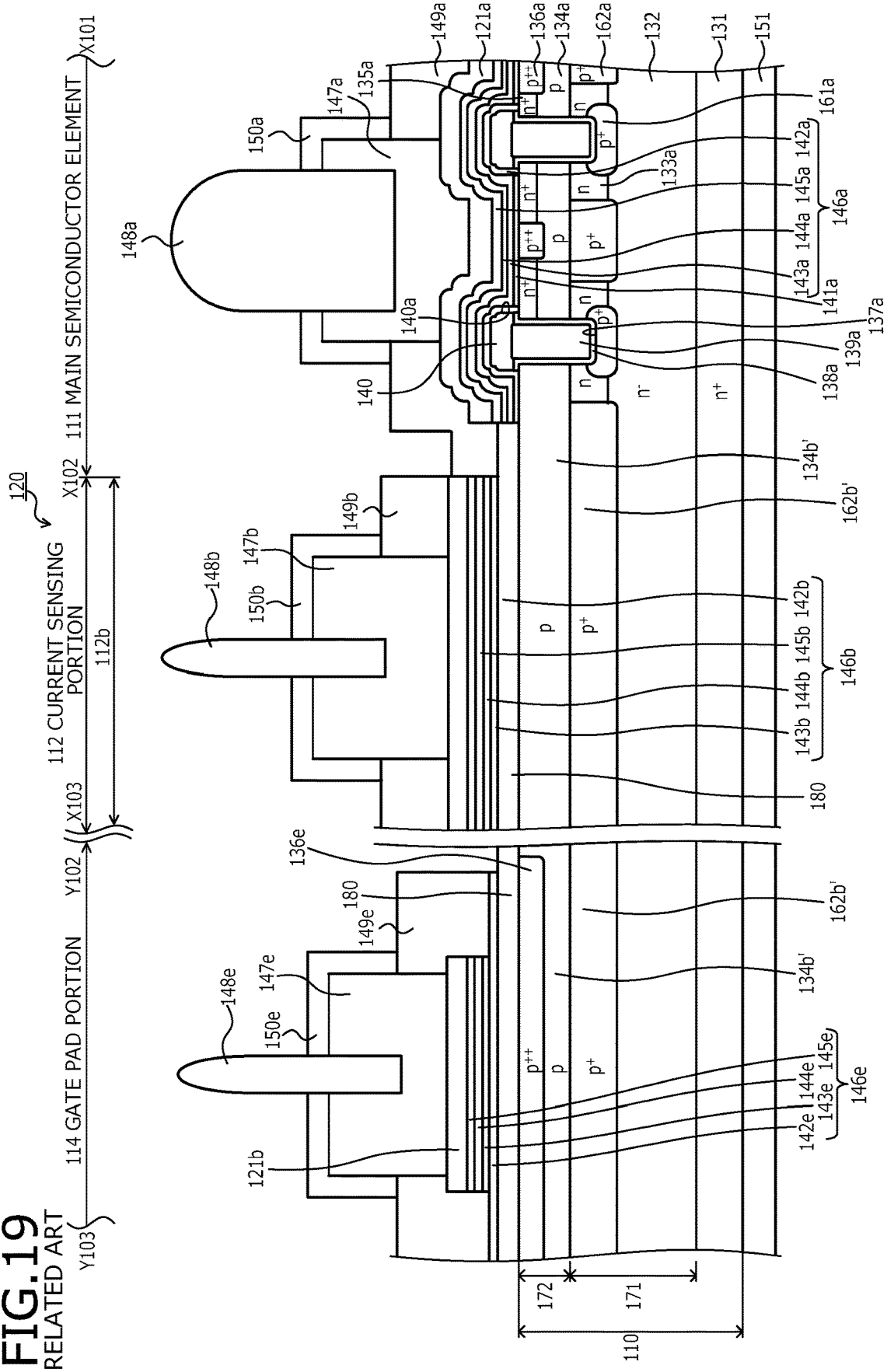
FIG. 19 is a cross-sectional view of a structure of the active region depicted in FIG. 16.

A semiconductor device according to a fifth embodiment will be described. FIG. 15 is a cross-sectional view of a structure of the semiconductor device according to the fifth embodiment. A semiconductor device 210 according to the fifth embodiment depicted in FIG. 15 has a layout as viewed from the front side of the semiconductor substrate 10 similar to that of the first embodiment (FIG. 1). FIG. 15 is a cross-sectional view of the structure of the active region of FIG. 1. FIG. 15 depicts a cross-section (cross-section of the structure along cutting line X1-X2-X3-X4-X5) of the structure of the main effective region 1a and the current sensing portion 12. Cross-sections of the structure of the temperature sensing portion 13 and the gate pad portion 14 are similar to those in FIGS. 2 and 3.

The semiconductor device 210 according to the fifth embodiment differs from the semiconductor device 20 according to the first embodiment (refer to FIGS. 1 to 3) in that an oxide film on the front surface of the semiconductor substrate 10 in the main non-operating region 1b is thicker at a portion thereof covering the n⁻-type region 32b. In particular, between the front surface of the semiconductor substrate 10 and the extended portions 38b' of the gate insulating films 38b of the current sensing portion 12, an oxide film 55 covering the n⁻-type region 32b is provided. The oxide film 55, similarly to the n⁻-type region 32b, surrounds a periphery of the sensing effective region 12a in a substantially rectangular shape. The thickness of the oxide film 55, for example, may be thicker than a thickness of the extended portions 38b' of the gate insulating films 38b.

As described above, according to the fifth embodiment, effects similar to those of the first to the fourth embodiments may be obtained. Further, according to the fifth embodiment, near the n⁻-type region that surrounds a periphery of the sensing effective region, dielectric breakdown voltage of the oxide film on the front surface of the semiconductor substrate may be enhanced.

In the foregoing, the present invention is not limited to the embodiments described above and various modifications within a range not departing from the spirit of the invention are possible. For example, in the active region, disposal of the main non-operating region may be variously modified, and the main non-operating region may be disposed near a center of the active region and a periphery thereof may be surrounded by the main effective region. Further, for example, trench gate structures of the main semiconductor element and the current sensing portion may be replaced by planar gate structures. Instead of silicon carbide as a semiconductor material, when a wide bandgap semiconductor material other than silicon carbide is used as a semiconductor material, the present invention is further applicable. Further, the present invention is similarly implemented when the conductivity types (n-type, p-type) are reversed.

According to the invention described above, the gate capacitance of the second insulated gate field effect transistor may be increased by an amount equivalent to the gate capacitance of the planar gate structure disposed on the first main surface of the semiconductor substrate, in a non-operating region.

The semiconductor device according to the present invention achieves an effect in that in a semiconductor device having a current sensing portion on a single semiconductor substrate having a main semiconductor element, ESD capability of the current sensing portion may be enhanced.

As described, the semiconductor device according to the present invention is useful for semiconductor devices having a current sensing portion on a single semiconductor substrate having a main semiconductor element.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device, comprising:
a semiconductor substrate having a first main surface and a second main surface opposite to the first main surface, the semiconductor substrate having, in a top view of the semiconductor device, first and second effective regions and a non-operating region that excludes the first and the second effective regions;
a first first-conductivity-type region, provided in the semiconductor substrate;
a first second-conductivity-type region, provided between the first main surface of the semiconductor substrate and the first first-conductivity-type region;
a first insulated gate field effect transistor formed in the first effective region, the first insulated gate field effect transistor having a drift region that is formed by the first first-conductivity-type region, and a base region that is formed by the first second-conductivity-type region, the first insulated gate field effect transistor including a plurality of first unit cells each having a first cell structure;
a first source pad for the first insulated gate field effect transistor, provided at the first main surface of the semiconductor substrate, the first source pad being electrically connected to the first second-conductivity-type region;
a second second-conductivity-type region, provided between the first main surface of the semiconductor substrate and the first first-conductivity-type region, in a region different from the first second-conductivity-type region;
a second insulated gate field effect transistor provided in the second effective region, the second insulated gate field effect transistor having a drift region that is formed by the first first-conductivity-type region, and a base region that is formed by the second second-conductivity-type region, the second insulated gate field effect transistor including a plurality of second unit cells each having a second cell structure, the first and second cell structures being the same, a total number of the second unit cells being less than a total number of the first unit cells;
a second source pad for the second insulated gate field effect transistor, provided on the first main surface of the semiconductor substrate, separate from the first source pad, the second source pad being electrically connected to the second second-conductivity-type region;
a third second-conductivity-type region provided in the non-operating region, between the first main surface of the semiconductor substrate and the first first-conductivity-type region, the third second-conductivity-type region surrounding a periphery of the second effective region and being separate from the second effective region;
a planar gate structure configured by a gate insulating film and a gate electrode, for the second insulated gate field effect transistor, extending on the first main surface of the semiconductor substrate in the non-operating region;
a second first-conductivity-type region, provided in the non-operating region, between the first main surface of the semiconductor substrate and the third second-con- ductivity-type region, the second first-conductivity-type region facing the planar gate structure in a depth direction;

a fourth second-conductivity-type region, provided in the non-operating region, between the first main surface of the semiconductor substrate and the second first-conductivity-type region, the fourth second-conductivity-type region facing the planar gate structure in the depth direction;

a third first-conductivity-type region, provided between the second main surface of the semiconductor substrate and the first first-conductivity-type region, the third first-conductivity-type region having an impurity concentration that is higher than an impurity concentration of the first first-conductivity-type region; and a drain electrode common to the first insulated gate field effect transistor and the second insulated gate field effect transistor, the drain electrode forming an ohmic contact with the second main surface of the semiconductor substrate and being electrically connected to the third first-conductivity-type region.

2. The semiconductor device according to claim 1, wherein
the second source pad covers a region of the semiconductor substrate;
the second effective region is a portion of the region covered by the second source pad, and
the planar gate structure is provided in the region covered by the second source pad but not in the second effective region.

3. The semiconductor device according to claim 2, further comprising
one or more electrode pads provided, separately from the first source pad and the second source pad, on the first main surface of the semiconductor substrate in the non-operating region, wherein
the planar gate structure extends directly beneath at least one of the one or more electrode pads.

4. The semiconductor device according to claim 1, further comprising:
a fourth first-conductivity-type region, provided between the second second-conductivity-type region and the third second-conductivity-type region, the fourth first-conductivity-type region surrounding a periphery of the second second-conductivity-type region; and
an oxide film provided between the gate insulating film configuring the planar gate structure and the first main surface of the semiconductor substrate, the oxide film covering the fourth first-conductivity-type region.

5. The semiconductor device according to claim 1, wherein
a distance between the second second-conductivity-type region and the third second-conductivity-type region is at least 0.1 μm.

6. The semiconductor device according to claim 1, wherein
the second insulated gate field effect transistor detects overcurrent flowing in the first insulated gate field effect transistor.

7. The semiconductor device according to claim 1, wherein
the semiconductor substrate is formed of a semiconductor material having a bandgap that is wider than a bandgap of silicon.

* * * * *